US009812406B2

(12) United States Patent
Shen et al.

(10) Patent No.: US 9,812,406 B2
(45) Date of Patent: Nov. 7, 2017

(54) MICROELECTRONIC ASSEMBLIES WITH CAVITIES, AND METHODS OF FABRICATION

(71) Applicant: Invensas Corporation, San Jose, CA (US)

(72) Inventors: Hong Shen, Palo Alto, CA (US); Liang Wang, Milpitas, CA (US); Rajesh Katkar, San Jose, CA (US); Charles G. Woychik, San Jose, CA (US); Guilian Gao, San Jose, CA (US)

(73) Assignee: INVENSAS CORPORATION, San Jose, CA (US)

( * ) Notice: Subject to any disclaimer, the term of this patent is extended or adjusted under 35 U.S.C. 154(b) by 0 days.

(21) Appl. No.: 15/280,175

(22) Filed: Sep. 29, 2016

(65) Prior Publication Data
US 2017/0018510 A1    Jan. 19, 2017

Related U.S. Application Data

(63) Continuation of application No. 14/745,237, filed on Jun. 19, 2015, now Pat. No. 9,478,504.

(51) Int. Cl.
*H01L 23/12* (2006.01)
*H01L 23/00* (2006.01)
(Continued)

(52) U.S. Cl.
CPC .......... *H01L 23/562* (2013.01); *H01L 21/481* (2013.01); *H01L 21/486* (2013.01);
(Continued)

(58) Field of Classification Search
CPC ............... H01L 23/053; H01L 23/3114; H01L 23/49827; H01L 23/49838; H01L 23/562
(Continued)

(56) References Cited

U.S. PATENT DOCUMENTS

| 5,532,519 A | 7/1996 | Bertin et al. |
| 5,701,233 A | 12/1997 | Carson et al. |

(Continued)

FOREIGN PATENT DOCUMENTS

| EP | 1688994 B1 | 8/2008 |
| EP | 2546876 A1 | 1/2013 |

(Continued)

OTHER PUBLICATIONS

Written Opinion by the International Searching Authority for PCT Application No. PCT/IB2016/001138, dated Dec. 2, 2016. 10 pages.
(Continued)

*Primary Examiner* — Luan C Thai
(74) *Attorney, Agent, or Firm* — Haynes and Boone, LLP

(57) ABSTRACT

Die (110) are attached to an interposer (420), and the interposer/die assembly is placed into a lid cavity (510). The lid (210) is attached to the top of the assembly, possibly to the encapsulant (474) at the top. The lid's legs (520) surround the cavity and extend down below the top surface of the interposer's substrate (420S), possibly to the level of the bottom surface of the substrate or lower. The legs (520) may or may not be attached to the interposer/die assembly. In fabrication, the interposer wafer (420SW) has trenches (478) which receive the lid's legs during the lid placement. The interposer wafer is later thinned to remove the interposer wafer portion below the legs and to dice the interposer wafer. The thinning process also exposes, on the bottom, conductive vias (450) passing through the interposer substrate. Other features are also provided.

20 Claims, 24 Drawing Sheets

(51) Int. Cl.

| | | |
|---|---|---|
| *H01L 21/48* | (2006.01) | |
| *H01L 23/498* | (2006.01) | |
| *H01L 25/065* | (2006.01) | |
| *H01L 21/56* | (2006.01) | |
| *H01L 23/538* | (2006.01) | |
| *H01L 23/31* | (2006.01) | |
| *H01L 23/053* | (2006.01) | |
| *H01L 23/29* | (2006.01) | |
| *H01L 23/14* | (2006.01) | |
| *H01L 23/15* | (2006.01) | |
| *H01L 23/367* | (2006.01) | |

(52) U.S. Cl.
CPC ........ *H01L 21/4853* (2013.01); *H01L 21/561*
(2013.01); *H01L 23/053* (2013.01); *H01L 23/3114* (2013.01); *H01L 23/3128* (2013.01);
*H01L 23/49827* (2013.01); *H01L 23/49838*
(2013.01); *H01L 23/5384* (2013.01); *H01L 24/97* (2013.01); *H01L 25/0655* (2013.01);
*H01L 23/145* (2013.01); *H01L 23/147*
(2013.01); *H01L 23/15* (2013.01); *H01L 23/295* (2013.01); *H01L 23/3675* (2013.01);
*H01L 24/13* (2013.01); *H01L 24/16* (2013.01);
*H01L 24/32* (2013.01); *H01L 24/48* (2013.01);
*H01L 24/73* (2013.01); *H01L 24/92* (2013.01);
*H01L 2224/0401* (2013.01); *H01L 2224/04042*
(2013.01); *H01L 2224/13111* (2013.01); *H01L 2224/16227* (2013.01); *H01L 2224/32225*
(2013.01); *H01L 2224/32245* (2013.01); *H01L 2224/48227* (2013.01); *H01L 2224/73204*
(2013.01); *H01L 2224/73253* (2013.01); *H01L 2224/92225* (2013.01); *H01L 2224/97*
(2013.01); *H01L 2924/00014* (2013.01); *H01L 2924/10253* (2013.01); *H01L 2924/157*
(2013.01); *H01L 2924/15192* (2013.01); *H01L 2924/15311* (2013.01); *H01L 2924/15788*
(2013.01); *H01L 2924/167* (2013.01); *H01L 2924/1632* (2013.01); *H01L 2924/16153*
(2013.01); *H01L 2924/16235* (2013.01); *H01L 2924/16251* (2013.01); *H01L 2924/16315*
(2013.01); *H01L 2924/16787* (2013.01); *H01L 2924/16788* (2013.01); *H01L 2924/3511*
(2013.01)

(58) Field of Classification Search
USPC ........................................................ 257/704
See application file for complete search history.

(56) References Cited

U.S. PATENT DOCUMENTS

| | | | |
|---|---|---|---|
| 6,008,536 | A | 12/1999 | Mertol |
| 6,157,076 | A | 12/2000 | Azotea et al. |
| 6,222,722 | B1 | 4/2001 | Fukuzumi et al. |
| 6,251,796 | B1 | 6/2001 | Abdul-Ridha et al. |
| 6,322,903 | B1 | 11/2001 | Siniaguine et al. |
| 6,384,473 | B1 | 5/2002 | Peterson et al. |
| 6,403,444 | B2 | 6/2002 | Fukuzumi et al. |
| 6,451,650 | B1 | 9/2002 | Lou |
| 6,492,726 | B1 | 12/2002 | Quek et al. |
| 6,613,672 | B1 | 9/2003 | Wang et al. |
| 6,620,701 | B2 | 9/2003 | Ning |
| 6,624,505 | B2 | 9/2003 | Badehi |
| 6,717,254 | B2 | 4/2004 | Siniaguine |
| 6,746,876 | B2 | 6/2004 | Itoh et al. |
| 6,787,916 | B2 | 9/2004 | Halahan |
| 6,947,275 | B1 | 9/2005 | Anderson et al. |
| 6,958,285 | B2 | 10/2005 | Siniaguine |
| 7,011,988 | B2 | 3/2006 | Forcier |
| 7,049,170 | B2 | 5/2006 | Savastiouk et al. |
| 7,061,102 | B2 | 6/2006 | Eghan et al. |
| 7,115,988 | B1 | 10/2006 | Hool |
| 7,144,745 | B2 | 12/2006 | Badehi |
| 7,183,643 | B2 | 2/2007 | Gibson et al. |
| 7,186,586 | B2 | 3/2007 | Savastiouk et al. |
| 7,400,036 | B2 | 7/2008 | Tan |
| 7,656,023 | B2 * | 2/2010 | Sunohara ............ B81C 1/00301 257/701 |
| 7,670,921 | B2 | 3/2010 | Chinthakindi et al. |
| 7,786,591 | B2 | 8/2010 | Khan et al. |
| 7,863,096 | B2 | 1/2011 | England |
| 7,906,803 | B2 | 3/2011 | Shiova et al. |
| 7,928,548 | B2 | 4/2011 | Bernstein et al. |
| 7,964,508 | B2 | 6/2011 | Savastiouk et al. |
| 7,977,579 | B2 | 7/2011 | Bathan et al. |
| 7,989,270 | B2 | 8/2011 | Huang et al. |
| 8,018,068 | B1 | 9/2011 | Scanlan et al. |
| 8,071,470 | B2 | 12/2011 | Khor et al. |
| 8,072,082 | B2 | 12/2011 | Yean et al. |
| 8,076,788 | B2 | 12/2011 | Haba et al. |
| 8,102,039 | B2 | 1/2012 | Noma et al. |
| 8,110,862 | B2 | 2/2012 | Cheng et al. |
| 8,183,696 | B2 | 5/2012 | Meyer et al. |
| 8,257,985 | B2 | 9/2012 | Stevenson et al. |
| 8,377,829 | B2 | 2/2013 | Yeh et al. |
| 8,378,480 | B2 | 2/2013 | Chen et al. |
| 8,397,013 | B1 | 3/2013 | Rosenband et al. |
| 8,426,961 | B2 | 4/2013 | Shih et al. |
| 8,470,668 | B2 | 6/2013 | Cho et al. |
| 8,518,753 | B2 | 8/2013 | Wu et al. |
| 8,519,537 | B2 | 8/2013 | Jeng et al. |
| 8,525,318 | B1 | 9/2013 | Kim |
| 8,575,493 | B1 | 11/2013 | Xu et al. |
| 8,598,695 | B2 | 12/2013 | Oganesian et al. |
| 8,629,546 | B1 | 1/2014 | Scanlan |
| 8,674,423 | B2 | 3/2014 | Collins et al. |
| 8,830,689 | B2 | 9/2014 | Kim et al. |
| 8,872,312 | B2 * | 10/2014 | Wang .................. H01L 23/3128 257/421 |
| 9,165,793 | B1 | 10/2015 | Wang et al. |
| 9,252,127 | B1 | 2/2016 | Shen et al. |
| 2004/0134796 | A1 | 7/2004 | Shelp et al. |
| 2004/0174682 | A1 | 9/2004 | Lin et al. |
| 2004/0178495 | A1 | 9/2004 | Yean |
| 2004/0183187 | A1 | 9/2004 | Yamasaki et al. |
| 2004/0201111 | A1 | 10/2004 | Thurgood |
| 2004/0238934 | A1 | 12/2004 | Warner et al. |
| 2005/0046002 | A1 | 3/2005 | Lee |
| 2005/0047094 | A1 | 3/2005 | Hsu |
| 2005/0068739 | A1 | 3/2005 | Arvelo et al. |
| 2005/0196095 | A1 | 9/2005 | Karashima et al. |
| 2005/0263869 | A1 | 12/2005 | Tanaka et al. |
| 2005/0266701 | A1 | 12/2005 | Aoyagi |
| 2007/0029654 | A1 | 2/2007 | Sunohara et al. |
| 2007/0045798 | A1 | 3/2007 | Horie |
| 2007/0197013 | A1 | 8/2007 | Trezza |
| 2007/0221399 | A1 | 9/2007 | Nishizawa et al. |
| 2007/0235850 | A1 | 10/2007 | Gerber et al. |
| 2008/0128897 | A1 | 6/2008 | Chao |
| 2008/0244902 | A1 | 10/2008 | Blackwell |
| 2008/0280394 | A1 | 11/2008 | Murtuza |
| 2009/0008762 | A1 | 1/2009 | Jung |
| 2009/0115047 | A1 | 5/2009 | Haba et al. |
| 2009/0212407 | A1 | 8/2009 | Foster et al. |
| 2009/0267238 | A1 | 10/2009 | Joseph et al. |
| 2010/0025081 | A1 | 2/2010 | Arai et al. |
| 2010/0081236 | A1 | 4/2010 | Yang et al. |
| 2010/0084761 | A1 | 4/2010 | Shinagawa |
| 2010/0134991 | A1 | 6/2010 | Kim |
| 2010/0144101 | A1 | 6/2010 | Chow |
| 2010/0224980 | A1 | 9/2010 | Chahal |
| 2010/0230797 | A1 | 9/2010 | Honda |
| 2010/0230806 | A1 | 9/2010 | Huang et al. |
| 2010/0276799 | A1 | 11/2010 | Heng et al. |
| 2011/0027967 | A1 | 2/2011 | Beyne et al. |
| 2011/0068444 | A1 | 3/2011 | Chi et al. |
| 2011/0068468 | A1 | 3/2011 | Lin |
| 2011/0080713 | A1 | 4/2011 | Sunohara |

(56) References Cited

U.S. PATENT DOCUMENTS

| | | |
|---|---|---|
| 2011/0095403 A1 | 4/2011 | Lee et al. |
| 2011/0101349 A1 | 5/2011 | Oda |
| 2011/0215470 A1 | 9/2011 | Chen et al. |
| 2011/0221072 A1 | 9/2011 | Chin |
| 2011/0287606 A1 | 11/2011 | Brun et al. |
| 2011/0300668 A1 | 12/2011 | Parvarandeh |
| 2011/0304036 A1 | 12/2011 | Son |
| 2012/0001339 A1 | 1/2012 | Malatkar |
| 2012/0020026 A1 | 1/2012 | Oganesian et al. |
| 2012/0049332 A1 | 3/2012 | Chen et al. |
| 2012/0061852 A1 | 3/2012 | Su et al. |
| 2012/0086135 A1 | 4/2012 | Thompson et al. |
| 2012/0091583 A1 | 4/2012 | Kawashita et al. |
| 2012/0098119 A1 | 4/2012 | Refai-Ahmed et al. |
| 2012/0101540 A1 | 4/2012 | O'Brien et al. |
| 2012/0106228 A1 | 5/2012 | Lee |
| 2012/0228778 A1 | 9/2012 | Kosenko et al. |
| 2012/0276733 A1 | 11/2012 | Saeki et al. |
| 2012/0295415 A1 | 11/2012 | Ono |
| 2012/0319300 A1 | 12/2012 | Kim |
| 2013/0010441 A1 | 1/2013 | Oganesian et al. |
| 2013/0014978 A1 | 1/2013 | Uzoh et al. |
| 2013/0032390 A1 | 2/2013 | Hu et al. |
| 2013/0069239 A1 | 3/2013 | Kim et al. |
| 2013/0082383 A1 | 4/2013 | Aoya |
| 2013/0082399 A1 | 4/2013 | Kim et al. |
| 2013/0087917 A1 | 4/2013 | Jee et al. |
| 2013/0093075 A1 | 4/2013 | Liu et al. |
| 2013/0099368 A1 | 4/2013 | Han |
| 2013/0119527 A1 | 5/2013 | Luo et al. |
| 2013/0119528 A1 | 5/2013 | Groothuis et al. |
| 2013/0146991 A1 | 6/2013 | Otremba et al. |
| 2013/0181354 A1 | 7/2013 | Khan et al. |
| 2013/0187292 A1 | 7/2013 | Semmelmeyer et al. |
| 2013/0228898 A1 | 9/2013 | Ide |
| 2013/0241026 A1 | 9/2013 | Or-Bach et al. |
| 2013/0267046 A1 | 10/2013 | Or-Bach et al. |
| 2013/0270660 A1 | 10/2013 | Bryzek et al. |
| 2013/0292840 A1 | 11/2013 | Shoemaker et al. |
| 2013/0313680 A1 | 11/2013 | Oganesian et al. |
| 2014/0036454 A1 | 2/2014 | Caskey et al. |
| 2014/0070380 A1 | 3/2014 | Chiu et al. |
| 2014/0091461 A1 | 4/2014 | Shen |
| 2014/0134803 A1 | 5/2014 | Kelly et al. |
| 2014/0134804 A1 | 5/2014 | Kelly et al. |
| 2014/0225244 A1 | 8/2014 | Smith et al. |
| 2014/0246227 A1 | 9/2014 | Lin et al. |
| 2014/0252655 A1 | 9/2014 | Tran et al. |
| 2014/0264821 A1 | 9/2014 | Tang et al. |
| 2014/0319683 A1 | 10/2014 | Lin et al. |
| 2014/0361410 A1 | 12/2014 | Yamamichi et al. |
| 2015/0001731 A1 | 1/2015 | Shuto |
| 2015/0021755 A1 | 1/2015 | Hsiao et al. |
| 2015/0262902 A1 | 9/2015 | Shen et al. |
| 2015/0262928 A1 | 9/2015 | Shen et al. |
| 2015/0262972 A1 | 9/2015 | Katkar |

FOREIGN PATENT DOCUMENTS

| | | |
|---|---|---|
| WO | WO 2005/022630 A1 | 3/2005 |
| WO | WO 2006/124597 A2 | 11/2006 |
| WO | WO 2007/142721 A1 | 12/2007 |
| WO | WO 2009/070348 A1 | 6/2009 |
| WO | WO 2012/169162 A1 | 12/2012 |
| WO | WO 2013/062533 A1 | 5/2013 |

OTHER PUBLICATIONS

International Search Report by the International Searching Authority for PCT Application No. PCT/IB2016/001138, dated Dec. 2, 2016. 3 pages.

ChipScale Review, "The Impact of CSPs on Encapsulation Materials," ChipScale Review publication issue Mar. 1998, retrieved Feb. 21, 2014, 6 pages.

Dr. Paul A. Magill, "A New Thermal-Management Paradigm for Power Devices," Power Electronics Technology, Nov. 2008, pp. 26-30.

Herming Chiueh et al., "A Dynamic Thermal Management Circuit for System-On-Chip Designs," Analog Integrated Circuits and Signal Processing, 36, pp. 175-181, Jan. 25, 2003.

Hybrid Memory Cube Consortium, "Hybrid Memory Cube Specification 1.0," Last Revision Jan. 2013, 122 pages, Retrieved from: http://hybridmemorycube.org/specification-download/.

K. Zoschke et al., "Hermetic Wafer Level Packaging of MEMS Components Using Through Silicon Via and Wafer to Wafer Bonding Technologies" (2013 Electronic Components & Technology Conference, IEEE, pp. 1500-1507).

Lau et al., "Thin-Wafer Handling with a Heat-Spreader Wafer for 2.5D/3D IC Integration," 46$^{th}$ International Symposium on Microelectronics (IMAPS 2013) Sep. 30-Oct. 3, 2013, Orlando, FL USA, pp., 1-8 [389-396].

Li Shang et al., "Thermal Crisis: Challenges and Potential Solutions," Potentials, vol. 25, Issue 5, Sep./Oct. 2006, pp. 31-35.

Nakamura et al., "Technology Trends and Future History of Semiconductor Packaging Substrate Material," Hitachi Chemical Review Technical Report No. 55, May 2013, pp. 24-29.

Pulliam, Wayne, "Designing with BGAs," AMD presentation, 2008, 62 pages.

San Hwui Lee et al., "Wafer-to-Wafer Alignment for Three Dimensional Integration: A Review," Journal of Microelectromechanical Systems, vol. 20, Issue 4, Aug. 2011, pp. 885-898.

U.S. Appl. No. 14/201,585, filed Mar. 7, 2014.

U.S. Appl. No. 14/214,365 titled, "Integrated Circuits Protected by Substrates with Cavities, and Methods of Manufacture," filed Mar. 14, 2014, 40 pages.

Dreiza; Moody et al., "Joint Project for Mechanical Qualification of Next Generation High Density Package-on-Package (PoP) with Through Mold Via Technology," Amkor Technology, EMPC2009—17th European Microelectronics & Packaging Conference, Jun. 16, Rimini, Italy, 8 pages.

Zwenger; Curtis et al., "Next Generation Package-on_Package (PoP) Platform with Through Mold Via (TMV™) Interconnection Technology," Amkor Technology, Originally published in the proceedings of the IMPAS Device Packaging Conference, Scottsdale, AZ, Mar. 10-12, 2009, 8 pages.

Kim; Jinseong et al., "Application of Through Mold Via (TMV) as PoP base package," Amkor Technology, 2008 IEEE Reprinted from ECTC2008 Proceedings, 6 pages.

U.S. Appl. No. 14/250,317 titled "Die Stacks With One or More Bond Via Arrays," filed Apr. 10, 2014, 58 pages.

Das; Rabindra N. et al., "Package-Interpose-Package (PIP) Technology for High End Electronics," Endicott Interconnect Technologies, Inc., retrieved Jul. 31, 2014, 4 pages.

McCormick; Heather et al., "Assembly and Reliability Assessment of Fine Pitch TMV Package on Package (PoP) Components, " Amkor Technology Inc., Originally published in the Proceedings of the SMTA International Conference, San Diego, CA, Oct. 4-8, 2009, 8 pages.

U.S. Appl. No. 14/288,064 titled, "Integrated Circuit Assemblies With Reinforcement Frames, and Methods of Manufacture," filed May 27, 2014.

U.S. Appl. No. 14/328,380 titled, "Microelectronic Assemblies With Integrated Circuits and Interposers With Cavities, and Methods of Manufacture," filed Jul. 10, 2014.

International Search Report and Written Opinion, dated May 12, 2015, 11 pages, PCT Patent Application No. PCT/US2015/019609.

International Search Report and Written Opinion, dated Aug. 6, 2015, 10 pages, PCT Patent Application No. PCT/US2015/028172.

Turner et al., "Mechanics of direct wafer bonding", 2006, pp. 171-188, vol. 462, doi: 10.1098/rspa.2005.1571, Proceedings of the Royal Society A, London, United Kingdom.

U.S. First Action Interview Pilot Program Pre-Interview Communication, dated Oct. 22, 2014, for U.S. Appl. No. 14/214,365, filed Mar. 14, 2014.

(56) References Cited

OTHER PUBLICATIONS

Strandjord et al., "Bumping for WLCSP using Solder Ball Attach on electrolessss NiAu UBM", 2008, 29 pages, Pac Tech USA—Packaging Technologies, Inc., Santa Clara, California.
Boyle et al., "Epoxy Resins", 2001, pp. 78-89, vol. 21, ASM Handbook, Composites (ASM International).
U.S. Patent Application, "Interposers With Circuit Modules Encapsulated by Moldable Material in a Cavity, and Methods of Fabrication", filed Dec. 2, 2014, U.S. Appl. No. 14/558,462, 19 pages.
Final Office Action dated Mar. 2, 2015 of U.S. Appl. No. 14/214,365.
Notice of Allowance dated Apr. 16, 2015 of U.S. Appl. No. 14/268,899.
Pre-Interview First Office Action dated Oct. 22, 2014 of U.S. Appl. No. 14/214,365.
U.S. Appl. No. 14/268,899 titled, "Making Electrical Components in Handle Wafers of Integrated Circuit Packages," filed May 2, 2014.
Office Action dated Jul. 9, 2015 for U.S. Appl. No. 14/558,462, 11 pages.
International Search Report dated Sep. 21, 2015 for International Application No. PCT/US2015/033786, International Filing Date Feb. 6, 2015.
International Search Report and Written Opinion for PCT/US2015/032572 dated Nov. 23, 2015.
Lau, John H., "TSV Interposer: The most Cost-Effective Integrator for 3D IC Integration," Electronics & Optoelectronics Research Laboratories, Industrial Technology Research Institute (ITRI), retrieved on Feb. 24, 2015.

\* cited by examiner

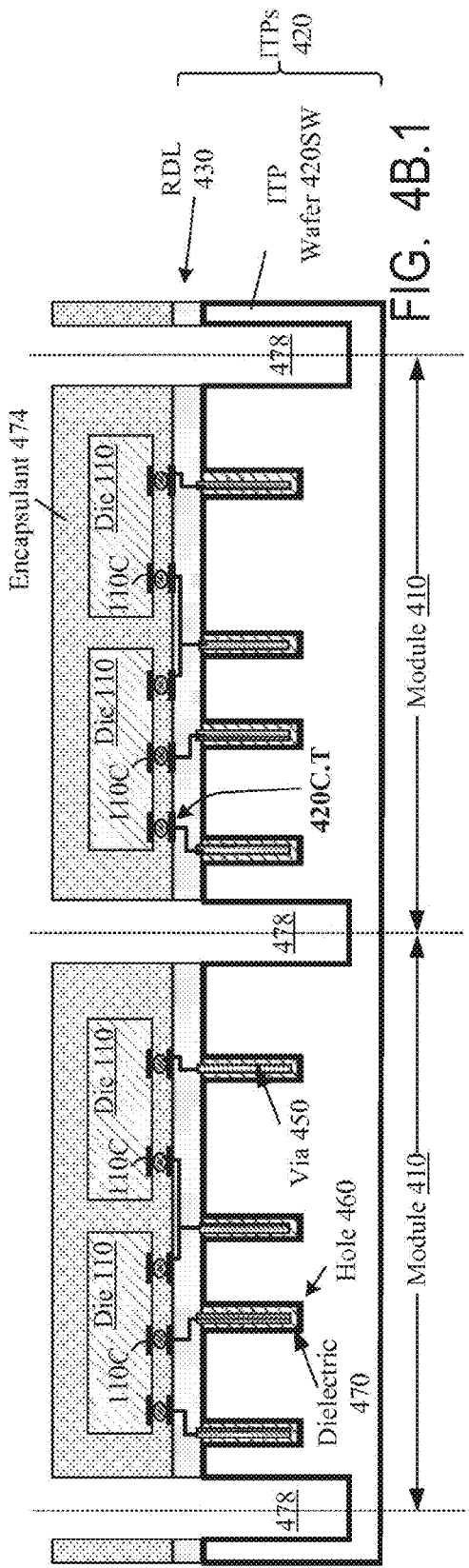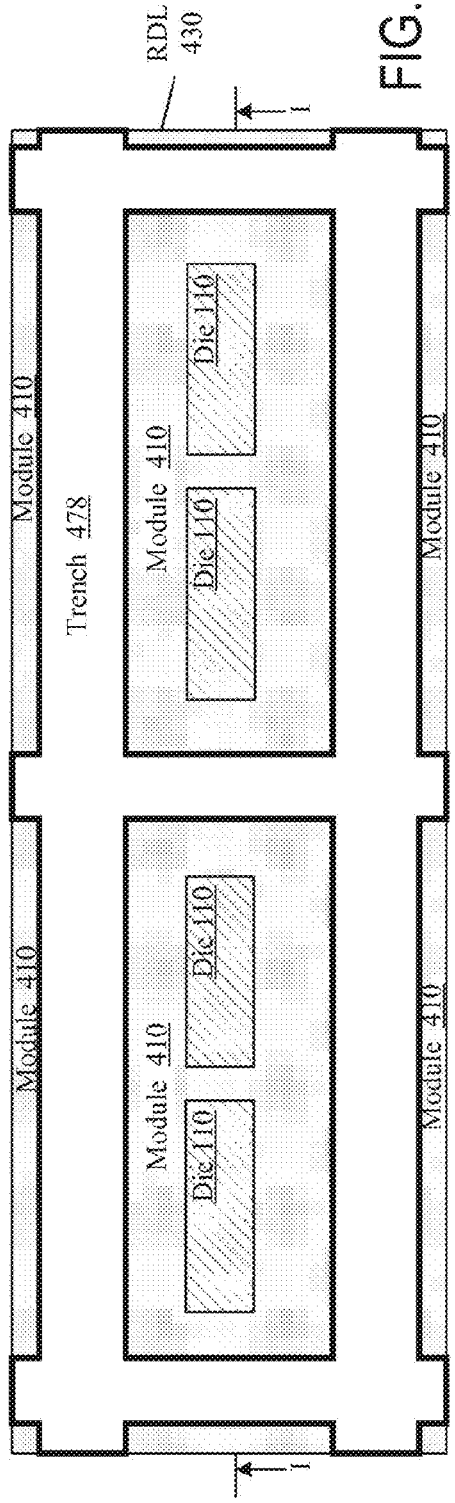

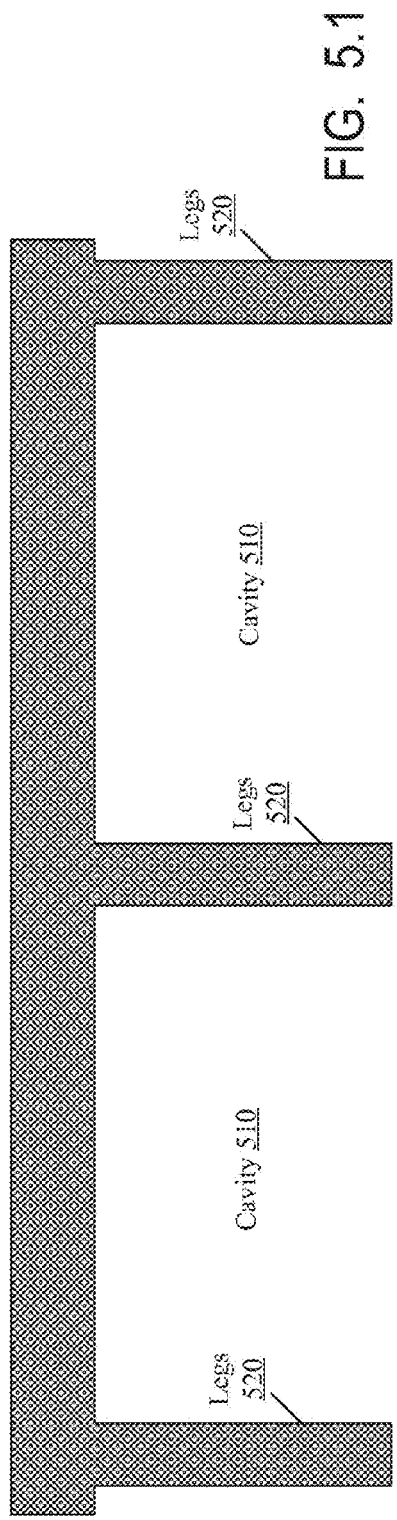
FIG. 5.1
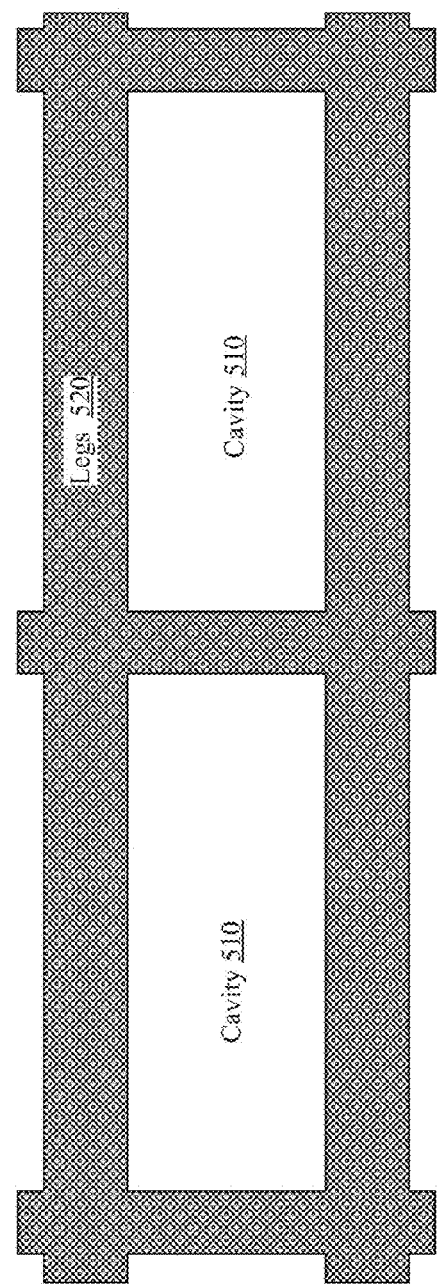
FIG. 5.2

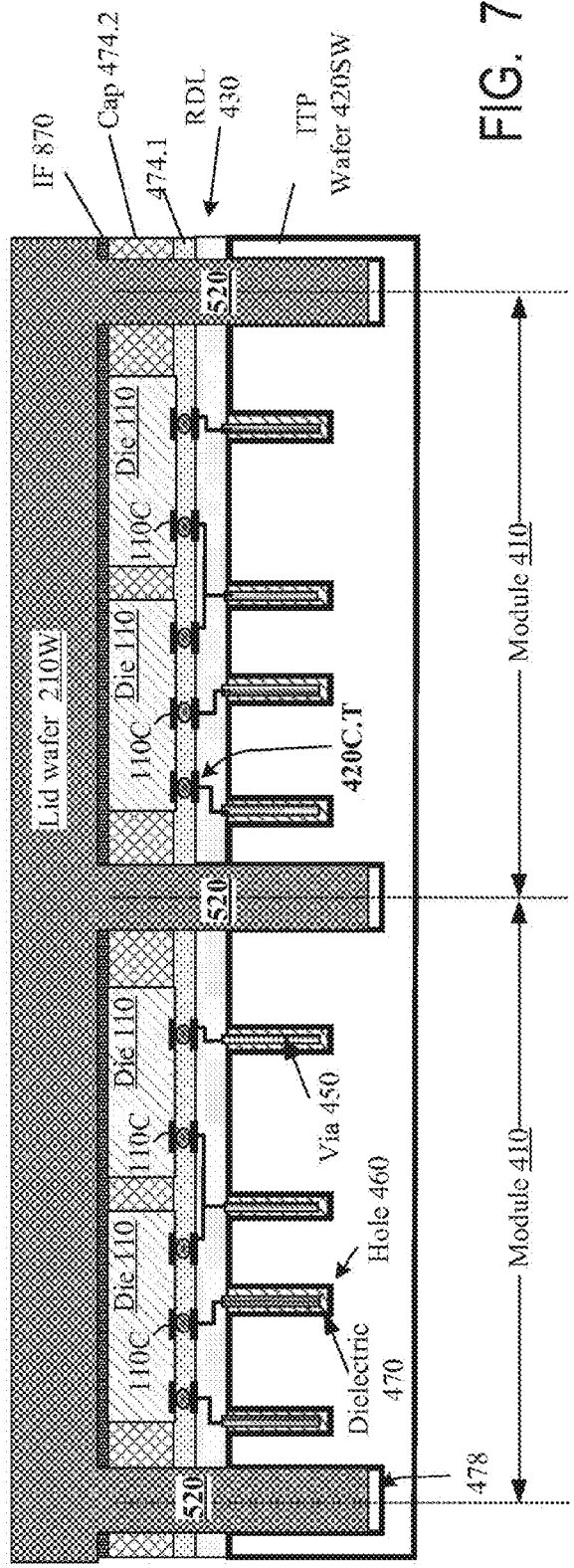

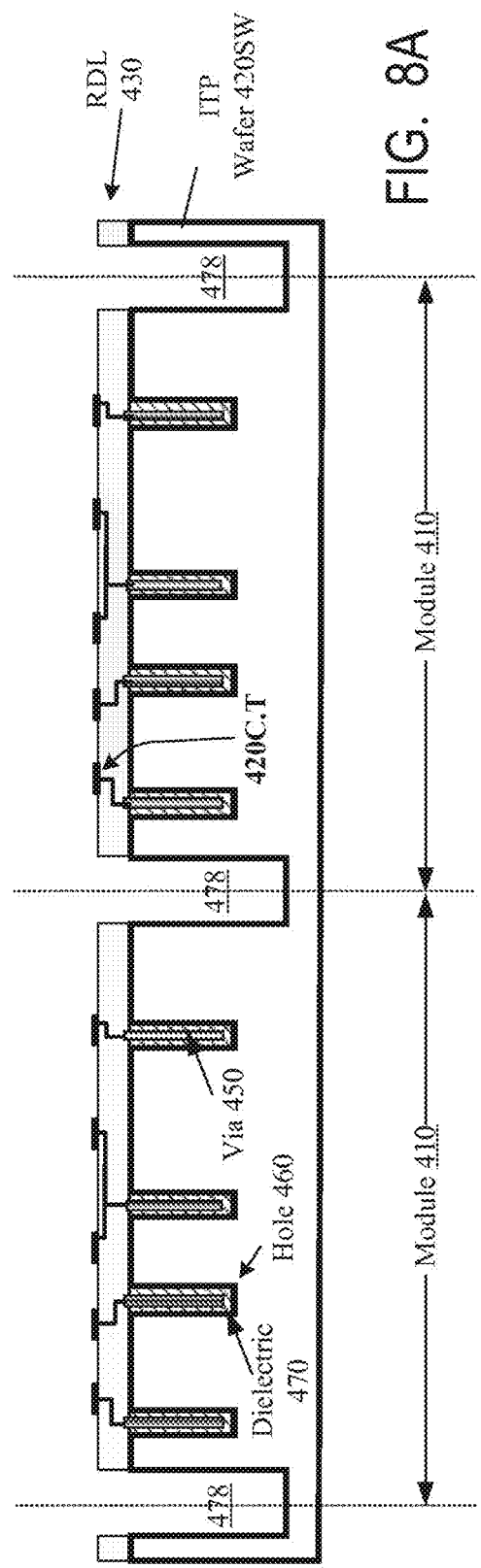

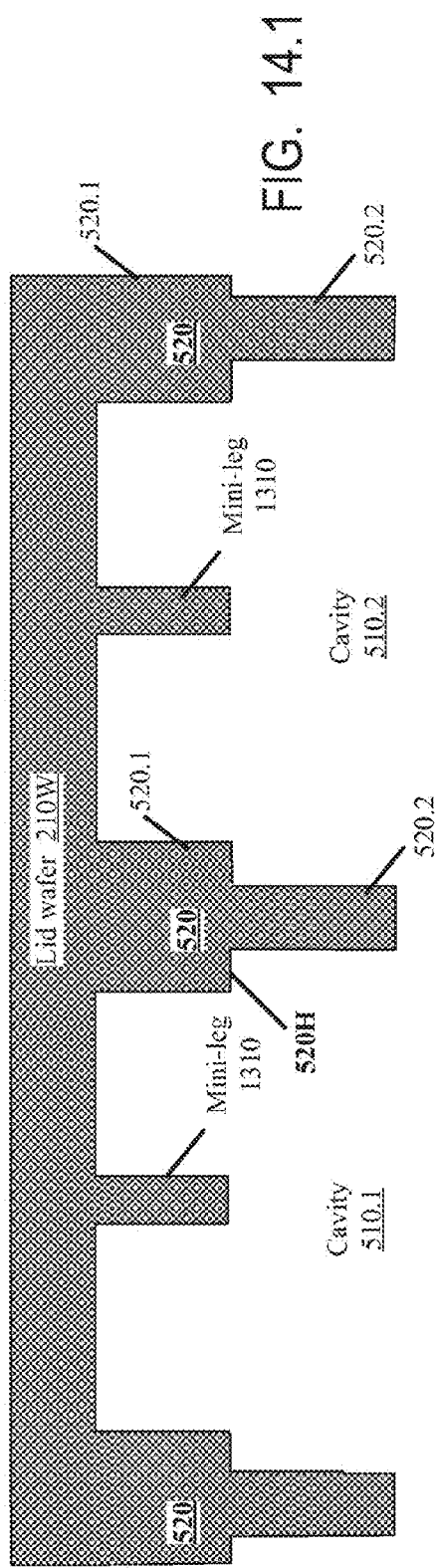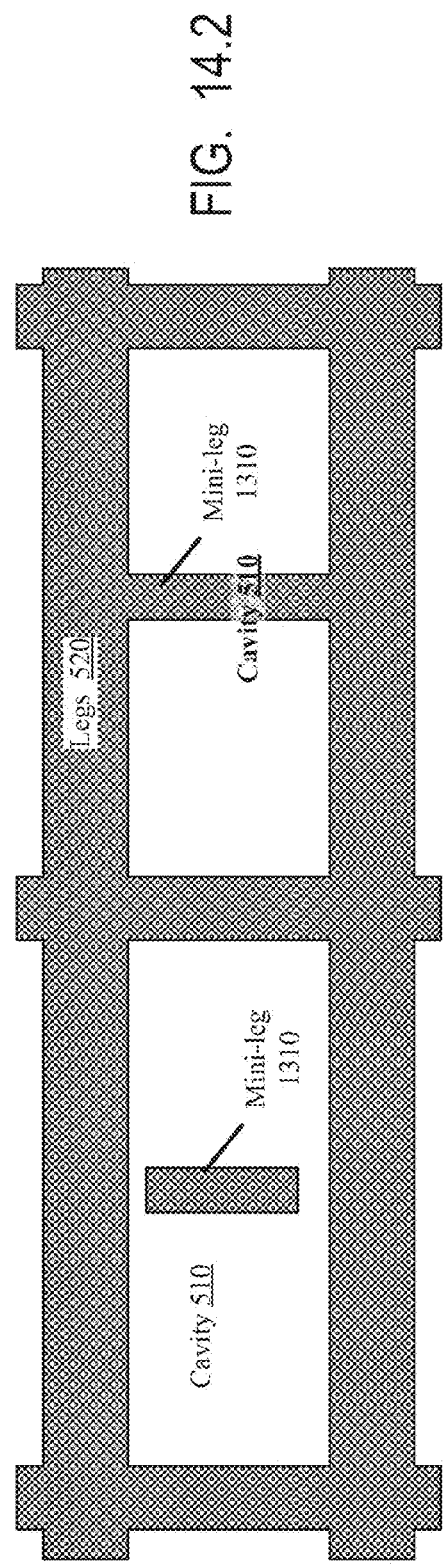

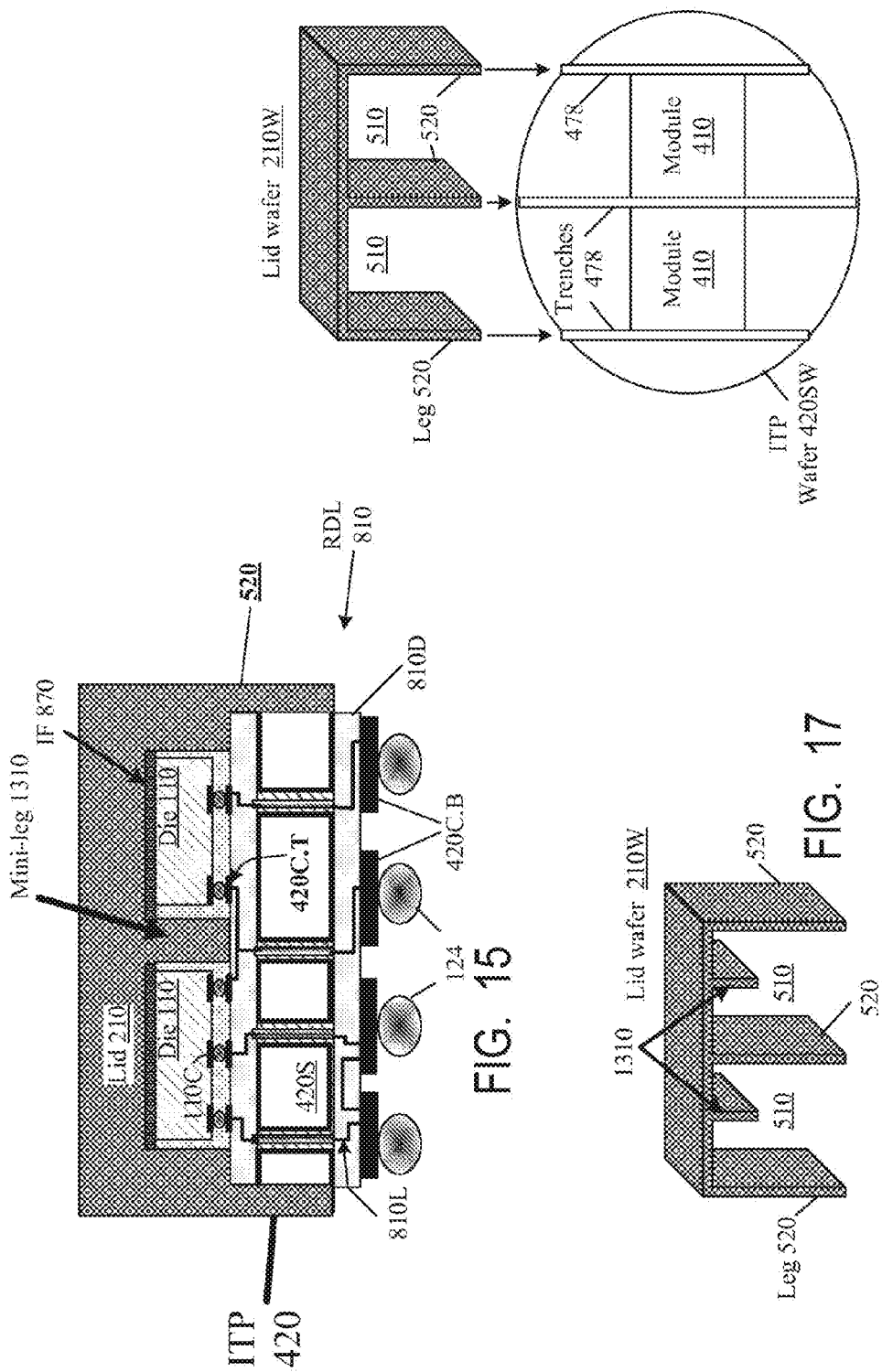

MICROELECTRONIC ASSEMBLIES WITH CAVITIES, AND METHODS OF FABRICATION

CROSS REFERENCE TO RELATED APPLICATIONS

The present application is a continuation of U.S. patent application Ser. No. 14/745,237, filed Jun. 19, 2015, incorporated herein by reference.

BACKGROUND OF THE INVENTION

The present invention relates to microelectronic assemblies and to methods for manufacturing such assemblies. Some embodiments provide reliable assemblies and simplify some aspects of the manufacturing process.

FIG. 1 illustrates a typical microelectronic assembly in which a semiconductor die 110 is attached to a wiring substrate (WS, e.g. printed circuit board) 120. The die was manufactured as part of a semiconductor wafer in a single process with other die, and was then separated from the wafer. The die's contact pads 110C are attached to contact pads 120C of WS 120. The attachments 124 can be solder for example. WS 120 has conductive lines 120L used to connect the die to other circuitry (not shown).

A common source of failure in microelectronic assemblies is cracking or detachment of connections 124 due to thermal stresses, i.e. mechanical stresses caused by thermal expansion and contraction that may occur during manufacture and subsequent use (operation) of the assembly. In particular, wiring substrates 120 are commonly made using organic or ceramic materials that have higher coefficients of thermal expansion (CTE) than the die's semiconductor materials (such as silicon). Therefore, when the assembly is heated, the WS expands more than the die, pulling the connections 124 sideways and causing damage. Further, such thermal stresses may warp the assembly and make it harder to connect the assembly to other circuits. In order to reduce the stresses on connections 124, underfill 130U (an adhesive) is introduced between the die and substrate 120 to glue the die to the substrate. However, a typical underfill is based on organic polymers which themselves have high CTEs and thus tend to increase the warpage.

To lessen the warpage, the assembly can be strengthened by a lid 210 (FIG. 2) glued to die 110 and WS 120 by adhesive generally shown at 130A. The lid can be made of metal because metals have high CTEs similar to the CTEs of organic polymers used in WS 120 and in adhesive 130A and 130U. In addition to strengthening the assembly, the metal serves as a heat sink removing heat from the assembly during manufacture and operation.

The assembly reliability may depend on the fabrication sequence; see U.S. pre-grant patent publication no. 2014/0091461 (Apr. 3, 2014; inventor: Shen). In a typical fabrication sequence, the die is attached to the WS, then underfill 130U is introduced in liquid form between the die and the WS. At this point, since the underfill is liquid (and therefore has a low elastic modulus), the underfill does not exert significant warping pressure on the WS. Then the underfill is cured to solid state (by heat for example); the underfill shrinks and may warp the structure. Then lid 210 is attached by adhesive 130A. The lid has to be pressed hard against the warped assembly to straighten the assembly. This pressure may break the assembly, and even if the assembly is not broken the assembly remains stressed, and this residual stress may break the assembly later on, especially when additional stresses are introduced by subsequent fabrication steps or during operation.

An alternative process suggested by the aforementioned patent publication 2014/0091461 is to attach the lid when the underfill is still liquid (uncured) or even before the underfill is deposited. For example, in FIG. 3A, die 110 was attached to the substrate, then lid 210 was attached to the die (by adhesive 130A) before the underfill 130U deposition. The structure was not affected by the underfill during the lid attachment, so the warpage was low or absent. Moreover, the lid is not directly attached to substrate 120, so the substrate warpage is less important for the lid attachment. Therefore, less pressure is needed for the lid attachment. Then (FIG. 3B) underfill 130U is introduced in liquid form and cured to directly attach both the die and the lid to the WS. During the curing process, the lid constrains the die's thermal deformation, and this may further reduce warpage caused by the curing process.

Other improvements are desired, especially if the die 110 is replaced by a multichip module (MCM) possibly containing a stack of die.

SUMMARY

This section summarizes some features of the invention. Other features may be described in the subsequent sections. The invention is defined by the appended claims, which are incorporated into this section by reference.

Some embodiments of the present invention provide manufacturing processes suitable for multichip modules. In some embodiments, as in the aforementioned patent application 2014/0091461, the lid is attached before underfill deposition, but the inventors go even further: the lid is attached before the module fabrication is completed. For example, the lid can be attached before formation of some of the MCM's contact pads.

In some embodiments, the lid is made using semiconductor material with a CTE that matches the MCM or at least one of the MCM's components (e.g. an interposer). Other features are explained below. The invention is not limited to the features and advantages described above except as defined by the appended claims.

BRIEF DESCRIPTION OF THE DRAWINGS

FIGS. 4A, 4B.1 show vertical cross sections of portions of microelectronic assemblies at different stages of fabrication according to some embodiments of the present invention.

FIG. 4B.2 is a plan view of a portion of a microelectronic assembly during fabrication according to some embodiments of the present invention.

FIG. 5.1 shows a vertical cross section of a portion of a microelectronic assembly during fabrication according to some embodiments of the present invention.

FIG. 5.2 is a plan view of a portion of a microelectronic assembly during fabrication according to some embodiments of the present invention.

FIGS. 6C, 6D, 6E, 7A, 7B, 7C, 8A, 8B, 8C, 9A, 9B, 9C, 10, 11, 12A, 12B, 13, 14.1 show vertical cross sections of portions of microelectronic assemblies at different stages of fabrication according to some embodiments of the present invention.

FIG. 14.2 is a plan view of a portion of a microelectronic assembly during fabrication according to some embodiments of the present invention.

FIG. 15 shows a vertical cross section of a portion of a microelectronic assembly during fabrication according to some embodiments of the present invention.

FIG. 16 shows a top view and a perspective view of portions of microelectronic assemblies at different stages of fabrication according to some embodiments of the present invention.

FIG. 17 is a perspective view of a portion of microelectronic assembly according to some embodiments of the present invention.

DESCRIPTION OF SOME EMBODIMENTS

The embodiments described in this section illustrate but do not limit the invention. The invention is defined by the appended claims.

Figure 1:
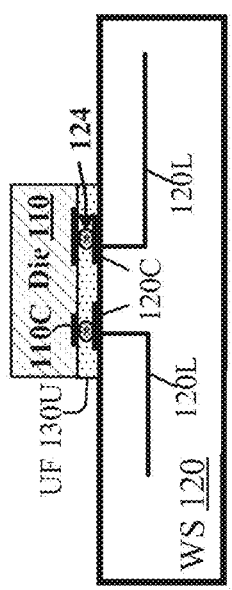
FIGS. 1, 2, 3A, 3B show vertical cross sections of microelectronic assemblies according to prior art.
Figure 4A:
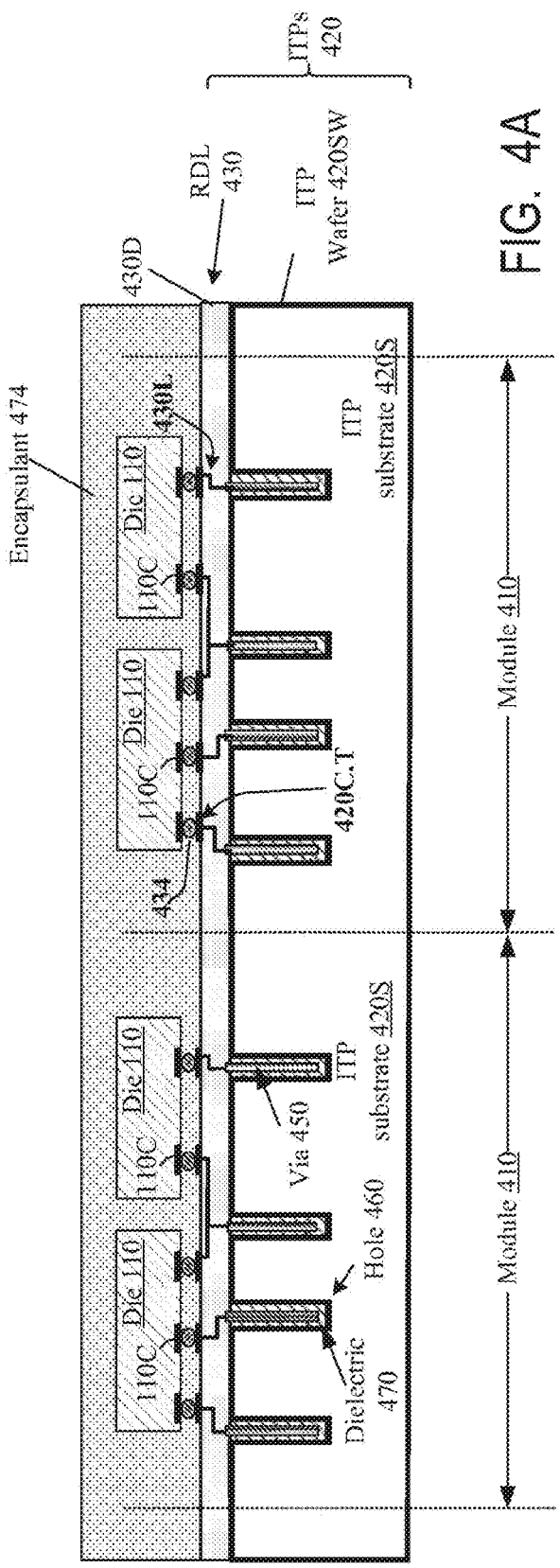

FIG. 4A illustrates early stages of fabrication of multichip modules 410 which of which contains a stack of die that will be capped by a lid according to some embodiments of the present invention. For illustration purposes, the figure shows multiple modules 410 fabricated in batch and later separated from each other. Modules 410 may have many different architectures, and for the sake of illustration each module 410 contains a stack of an interposer die 420 with two die 110 on top. Each interposer (ITP) 420 will have bottom contact pads attachable to other components, e.g. WS 120 of FIG. 1; these contact pads have not yet been formed. Thus, the die 110 will be connected to the WS or other components through the interposer rather than directly. The interposer can be used for various reasons. One reason is that sometimes the WS contact pads 120C (FIG. 1) cannot be positioned as closely together as the die's contact pads 110C due to different fabrication technologies used for the die and the WS. In such cases, ITP 420 provides "contact redistribution": the ITP's top contact pads 420C.T match the die's contact pads 110C, and ITP's bottom contact pads (not yet formed) will match the WS contact pads 120C.

Further, as noted above, the WS may have a significantly different CTE than the semiconductor die. ITP 120 provides a buffer that softens the impact of the CTE mismatch between the die and the WS. For example, if the die are silicon-based ICs, the ITP substrate 420S may be made of silicon to match the die CTE. As to the ITP-WS thermal mismatch, this mismatch is less damaging because the bonds between the ITP bottom contact pads 120C.B and the PCB contact pads 120C can be larger (due to their larger spacing) and hence stronger.

Additionally, interposer 420 can be used to provide some interconnections between the die 110 in addition to the interconnections provided by the WS. For example, the interposer includes conductive lines 430L which can interconnect the interposer's contact pads 420C.T attached to die's contact pads 110C. The interposer thus relieves the WS interconnect density.

The invention is not limited to such details, and in particular is not limited to any circuitry or materials, or to CTE or size or density or strength relationships between the die, the interposer, the contact pads, or other components, or to assemblies with interposers, unless required by the appended claims.

At the stage of FIG. 4A, the modules 410 may or may not be a conventional structure; for conventional examples, see e.g. U.S. Pat. No. 7,186,586 issued Mar. 6, 2007 to Savastiouk et al. and U.S. Pat. No. 7,964,508 issued Jun. 21, 2011 to Savastiouk et al., both incorporated herein by reference. In the example shown, each interposer's substrate 420S is part of a single wafer 420SW, e.g. monocrystalline or non-monocrystalline silicon or some other semiconductor material, or ceramic or organic material (e.g. organic polymer), possibly glass, possibly a laminated substrate. Each interposer includes conductive vias 450 that will be used to interconnect circuitry above and below the substrate 420S. These vias are shown as vertical, but the vias may have any geometry; for example, zigzag vias are common in laminated substrates. The vias may intersect. At the stage shown, the vias 450 do not yet go through wafer 420SW, but in other embodiments the vias may go through the substrates even at this initial stage. In the embodiment shown, the vias 450 are formed as follows. First, holes 460 are made in the top surface of the interposer wafer (e.g. by chemical etching, laser ablation, or some other method). The holes are lined with dielectric 470. The holes are then filled (or lined) with metal or some other conductor to provide vias 450. Dielectric 470 insulates vias 450 from substrates 420S (dielectric 470 can be omitted if, for example, the wafer 420SW is itself dielectric).

Redistribution layer (RDL) 430 is formed on top of each substrate 420S. RDL 430 includes contact pads 420C.T and interconnect lines 430L. Lines 430L interconnect the contact pads 420C.T and vias 450 in any desired pattern. RDL 430 also includes dielectric 430D which insulates the conductive lines 430L from each other and possibly from substrates 420S.

The die's contact pads 110C are attached to the interposers' contact pads 420C.T, by solder or other techniques, e.g. diffusion bonding or conductive or anisotropic adhesive or maybe other techniques. The connections are shown at 434. Alternatively, the die's contact pads can be connected to the interposers' contact pads by discrete bond-wires. In the embodiment shown, the die are underfilled and encapsulated by a suitable dielectric encapsulant 474, e.g. based on organic polymers such as epoxies, polyimides, silicone, polyurethane, poly-phenylene benzobisoxazole (PBO), benzocyclobutene (BCB), and/or others, possibly a tape (SU8), possibly having a high thermal conductivity (such as possessed by thermal interface materials), deposited by molding or printing or spin-coating or tape application or some other technique. Multiple encapsulant layers and materials can be present. (As used herein, "encapsulant" includes the underfill, which can be deposited separately from the rest of the encapsulant.) To provide high compliance, the encapsulant may have a low elastic modulus, e.g. 10 GPa or below, possibly at most 3 GPa, possibly as low as 500 MPa or even lower. However, higher modulus materials can also be used, e.g. silicon dioxide (47 GPa or higher). The encapsulant layer 474 may include multiple layers with the same or different elastic moduli, e.g. a low-modulus underfill (10 GPa or below) and a higher modulus overlying layer, as described in more detail below. The encapsulant has a planar top surface to simplify subsequent handling and other processing. These details are not limiting. For example, the underfill may be no-flow type; the underfill and the encapsulant may be omitted, and there may be many levels of die and interposers in MCMs 410 of many different MCM architectures. The encapsulant may have a metal filler, or may include multiple layers with upper layers containing a high content of metal fillers, for increased thermal conductivity.

Trench or trenches 478 (FIG. 4B.1, 4B.2) are holes formed in the top surface of interposer wafer 420SW. FIG. 4B.1 is a vertical cross section by the same cross-sectional plane as FIG. 4A; this plane is marked I-I in FIG. 4B.2, which shows an exemplary top view without encapsulant 474. The trenches surround each module 410. In this example, the trenches form a continuous rectangular lattice-like structure separating the modules 410 from each other. The trenches do not have to be rectangular. Also, the trench around each module 410 does not have to be continuous, it may be formed as disconnected pieces (with gaps therebetween) around a module 410. (We use the term "trench" to indicate any continuous segment of a trench; the term "trenches" may indicate discontinuous pieces or a continuous piece, so a continuous piece may be called either "trenches" or "trench".) In the vertical cross-section of FIG. 4B.1, the trenches have vertical sidewalls but this is not necessary.

The trenches are formed by removing portions of the encapsulant 474, RDL 430 (i.e. dielectric 430D), and wafer 420SW. In FIG. 4B.1, the trenches are deeper than vias 450 but this is not necessary. Exemplary dimensions could be as follows: wafer 420SW can be a silicon wafer at least 650 µm thick, the vias 450 can be 5 to 50 µm deep, and the trenches 478 can be at least 1 µm deeper (the trench depth is measured from the top of wafer 420SW). The trenches can be 10 µm wide. These dimensions are not limiting, and the dimensions may vary in the same embodiment; for example, the trenches may have a non-uniform depth or width.

The trenches can be formed using photolithography followed by chemical etching if wafer 420SW is semiconductor or glass or some other type, and/or using laser ablation and/or sawing and/or perhaps other techniques depending on the materials involved. If wafer 420SW is semiconductor or glass, then the trenches can be made with high precision (by photolithography and chemical etching for example); thus, in some embodiments, the minimal lateral spacing between the die 110 and the trenches 478 is 1 µm in some embodiments, and smaller spacing is possible.

Figure 2:
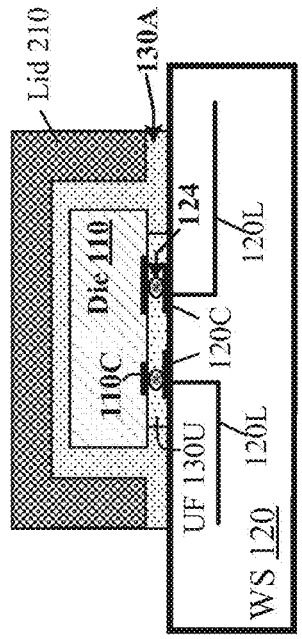
Figure 3A:
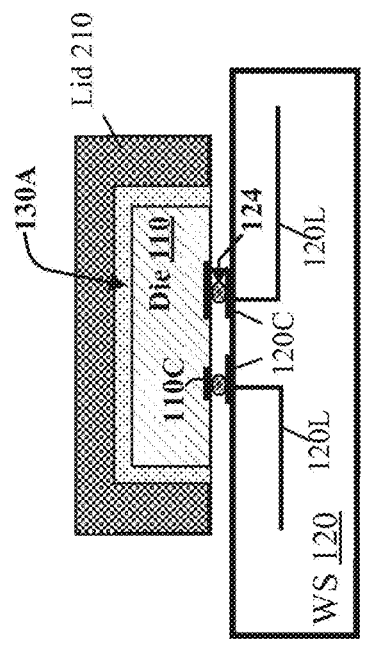
Figure 3B:
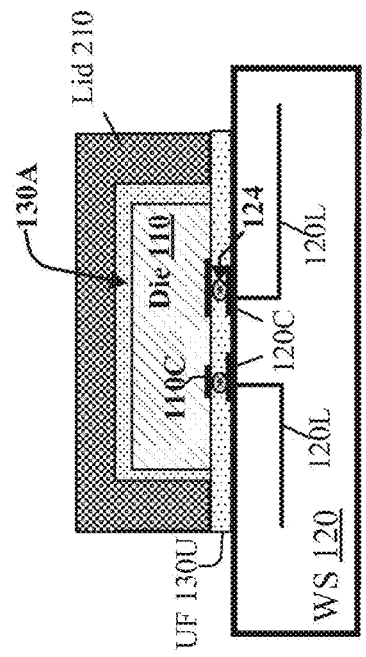

Separately (FIGS. 5.1 and 5.2), lids 210 are manufactured using, for example, prior art techniques as in FIG. 2 or 3A or 3B (as described in the aforementioned US 2014/0091461) or by other techniques. FIGS. 5.1 and 5.2 show an example in which multiple lids are formed in a single wafer 210W. FIG. 5.1 shows a vertical cross section of the wafer; the sectional plane corresponds to plane I-I in FIG. 4B.2— the two planes will coincide when the lid wafer is attached to the modules 410. FIG. 5.2 is the bottom view of the bottom surface of the lid wafer. In some embodiments, at the stage of FIG. 5.1, the lid wafer 210W has the same size as interposer wafer 420SW, but this is not necessary. Lid wafer 210W can be semiconductor material (e.g. silicon) or glass or ceramic or metal or some other type of material or combination of materials. Lid wafer 210W has a cavity 510 for each module 410. The cavity is surrounded by downward protrusions ("legs") 520. Legs 520 will be inserted into trenches 478. Legs 520 can have vertical sidewalls but this is not necessary. Also, inner surfaces of cavity 510 may have notches or other uneven features as in the aforementioned patent publication US 2014/0091461 (Shen) or of other type. Legs 520 can be continuous around each cavity 510, or may be discontinuous, e.g. formed as multiple downward protrusions (see the aforementioned publication US 2014/ 0091461), and/or may have holes therein, to accommodate thermal expansion or adhesive run-off (i.e. excess of the adhesive used in securing the lid to the modules 410), or possibly for other purposes.

The lid wafer can be manufactured starting with a planar wafer and forming cavities 510 by chemical etch (with photolithography) and/or mechanical and/or laser and/or some other means, or wafer 210W can be formed by mechanical stamping or molding or printing or possibly in some other way. The wafer can be a monolithic piece or multiple pieces attached together, by adhesive for example. Different pieces may or may not be the same material. If wafer 210W is made by chemical etching of a semiconductor or glass wafer and the cavities are defined by photolithography, then the cavities can be formed with high precision.

Figure 6A:
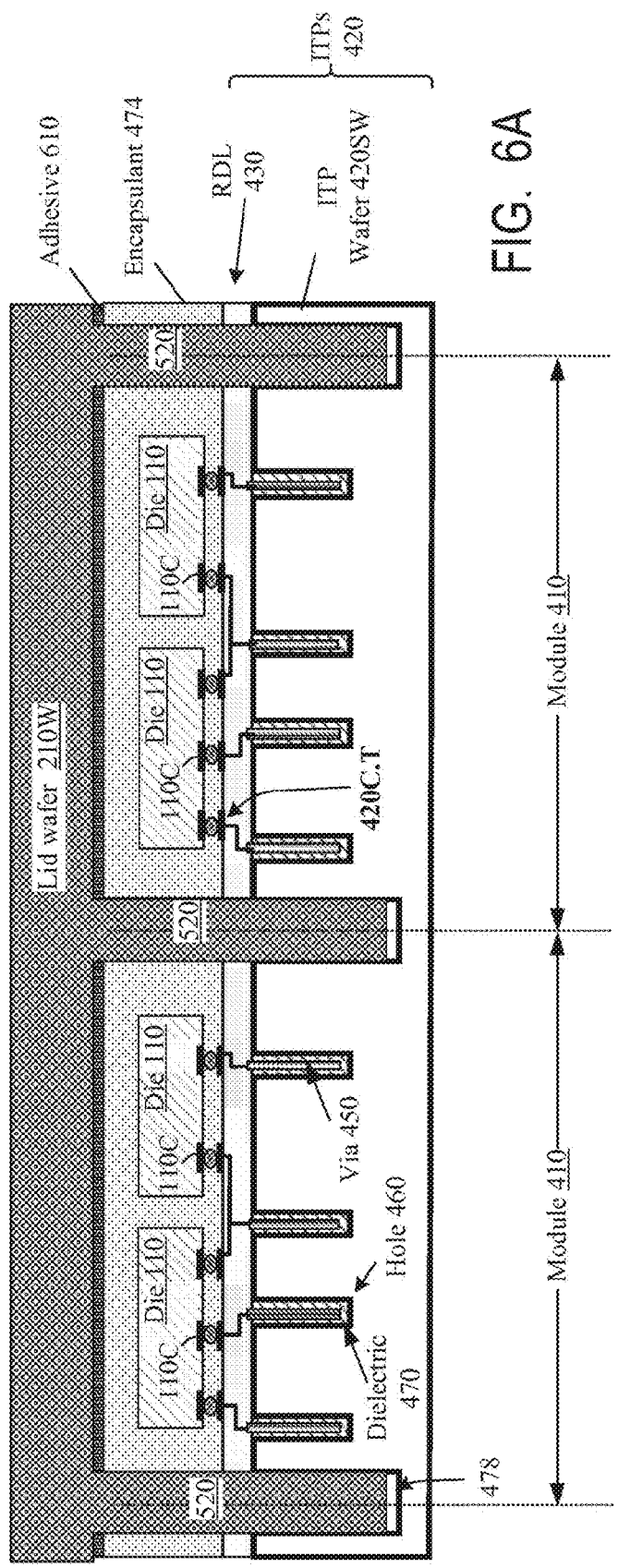
FIG. 6A shows a vertical cross section of a portion of a microelectronic assembly during fabrication according to some embodiments of the present invention.

As shown in FIG. 6A, lid 210 (the whole wafer 210W in this example) is attached to MCMs 410, with legs 520 in trenches 478. The attachment is by adhesive 610. Adhesive 610 can be a flowable type (e.g. based on an organic polymer) later cured using heat, laser or some other means; or a tape (e.g. SU8), or possibly some other type; see for example the materials described above for encapsulant 474. Adhesive 610 can be omitted if encapsulant 474 is thermoplastic and can itself be used as adhesive. In FIG. 6A, adhesive 610 is present only at the top surface of encapsulant 474, but the adhesive can be placed in the trenches or over any portion of the trench surface and/or MCM surface and/or the surface of cavity 510. Due to the large contact area between the lid 210 and the underlying structure, the adhesive 610 can be deposited in less than the entire contact area as needed to reduce warpage or thermal stresses or for other purposes. For example, in some embodiments, it is desirable not to attach the lid to the interposers 420 or at least to the interposer substrates 420S because the attachment may increase the interposer warpage, or because the reduced-warpage requirement would limit the choice of adhesive 610 materials. For example, organic polymeric adhesives may have much higher CTEs (10 or 15 ppm/° K or higher) than the interposers 420 or their substrates 420S (2.6 ppm/° K for silicon), and the CTE mismatch could undesirably stress the interposers and increase the interposer warpage. The organic polymeric adhesive's CTE can be reduced by inorganic fillers (e.g. silica, aluminum oxide, and others), but the fillers may undesirably increase the elastic modulus and thus increase thermal stresses on the interposer wafer. If the adhesive 610 is limited to the area above the encapsulant 474, the adhesive 610 can be easily matched to the encapsulant's CTE and can have a low elastic modulus.

In other embodiments, the situation may be the opposite: it may be desirable to use adhesive 610 to glue the legs 520 to interposer substrate 420S in order to prevent the legs from scratching the interposer substrates or for other purposes. The effect on the interposer warpage or of other stresses depends on the interposer substrate's thickness, the interposer and lid materials, the width of legs 520, and possibly other parameters. A proper amount and location of adhesive 610 can be determined experimentally for each type of assembly. For example, it may be desirable to provide adhesive 610 on legs 520 but not above encapsulant 474, or to provide the adhesive on the encapsulant's sidewalls but not elsewhere, etc.

Due to many choices present as to the placement of adhesive 610, the adhesive can be optimally placed to minimize the amount of the adhesive and thus reduce thermal and other mechanical stresses in the assembly.

In some embodiments, the legs 520 are sized for easy insertion into trenches 520; there is a gap between the leg surfaces and the trenches (the gap is shown only at the leg bottom). The gap further reduces mechanical stresses. In some embodiments, the gap is at least 1 μm (one micron), and the gap may vary over the leg surface. In some embodiments, the gap is 1 μm at the bottom. Other gap values are possible. In addition to stress reduction, the gap provides adhesive run-off room for possible excess of adhesive 610.

Figure 6B:
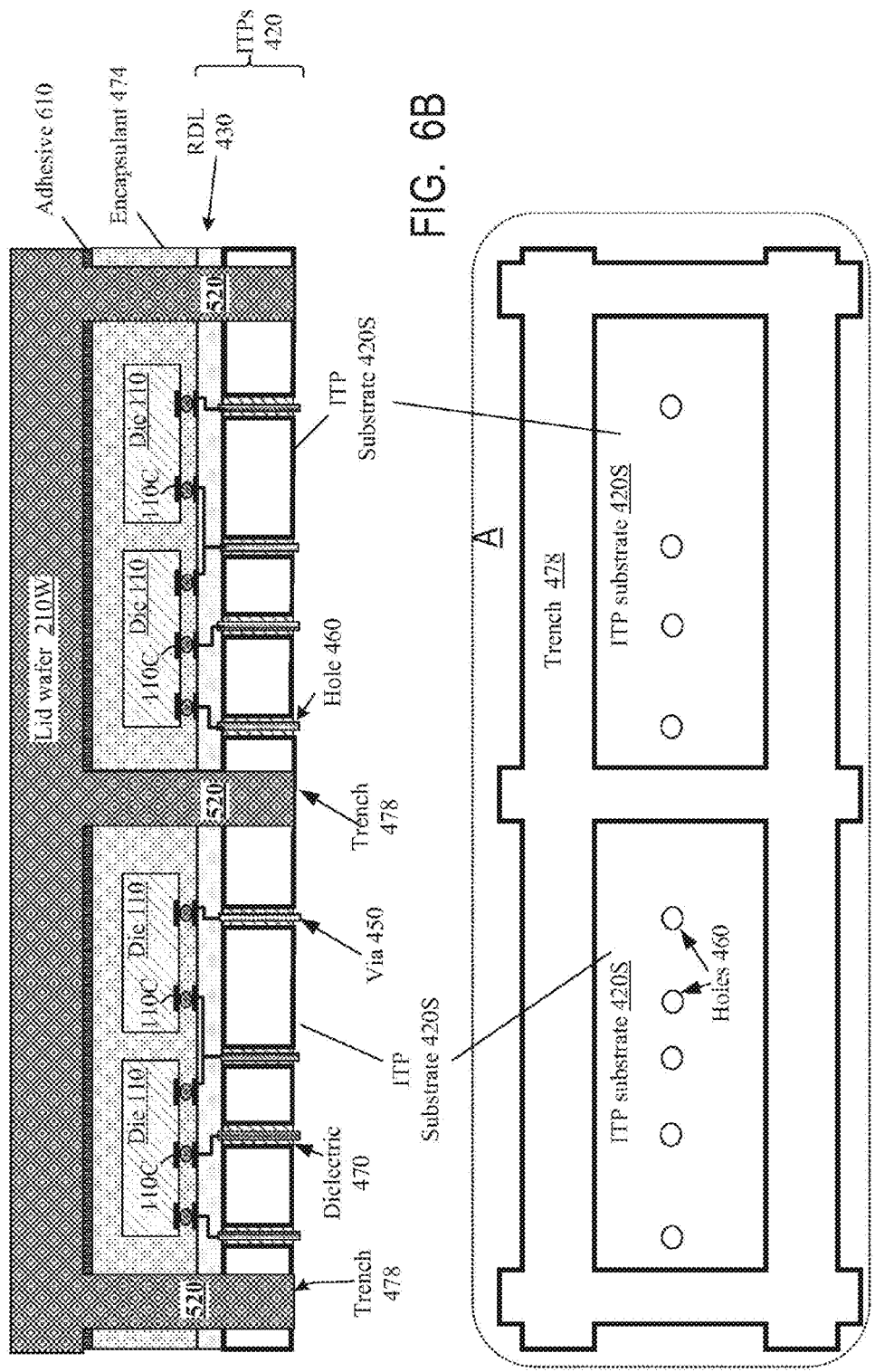
FIG. 6B shows a vertical cross section and a plan view of portions of a microelectronic assembly during fabrication according to some embodiments of the present invention.

As shown in FIG. 6B, after the lid attachment, the assembly is thinned from the bottom to expose the vias 450 on the bottom side. In some embodiments, the thinning is a blanket process, i.e. no mask is used. In the embodiment shown, the thinning also separates the interposer wafer 420SW into individual interposer die 420S; legs 520 and/or adhesive 610 may become exposed at the bottom. The individual interposer substrates 420S are shown in top view in insert A. The thinning process may also thin the lid wafer 210W by removing the bottom portions of legs 520. In some embodiments, when the thinning reaches the legs 520, the legs and the interposer substrates 420S are thinned simultaneously for a while. The simultaneous thinning may or may not continue at least until the vias 450 are exposed. In some embodiments, the dielectric 470 is removed by a separate thinning process which may or may not remove parts of legs 520.

The thinning process may involve mechanical processes (e.g. grinding and/or lapping and/or milling and/or polishing), and/or chemical-mechanical polishing (e.g. CMP), and/or chemical etching. In some embodiments, no mask is used. In some embodiments, the thinning starts as a mechanical process; mechanical processes are inexpensive and fast, but they tend to create more stress. The mechanical process (possibly including CMP) stops before exposure of vias 450 or even dielectric 470. Further thinning proceeds by chemical etching to expose the vias 450. In some of these embodiments, the mechanical thinning stops only after exposing the trenches 478. In some other embodiments, the entire thinning process is mechanical. In some of these embodiments, the trenches 478 are deeper than vias 450 and are exposed before the vias 450. This may be desirable because when the mechanical process reaches the trenches, there may be additional stresses generated that would be more likely to damage the vias 450 if the vias or the holes 460 were exposed at this stage. These stresses are further reduced by the gap between the trench bottom and legs 520 if the gap is present.

As a result of the thinning process, the bottom surface of legs 520 becomes level with the bottom surfaces of interposer substrates 420S. This is not necessary however: the interposer substrates' bottom surfaces can be above or below the bottoms of legs 520. Conductive vias 450 may or may not protrude out of the interposer substrates and may or may not protrude out of cavities 510, i.e. be below the bottoms of legs 520.

Figure 6C:
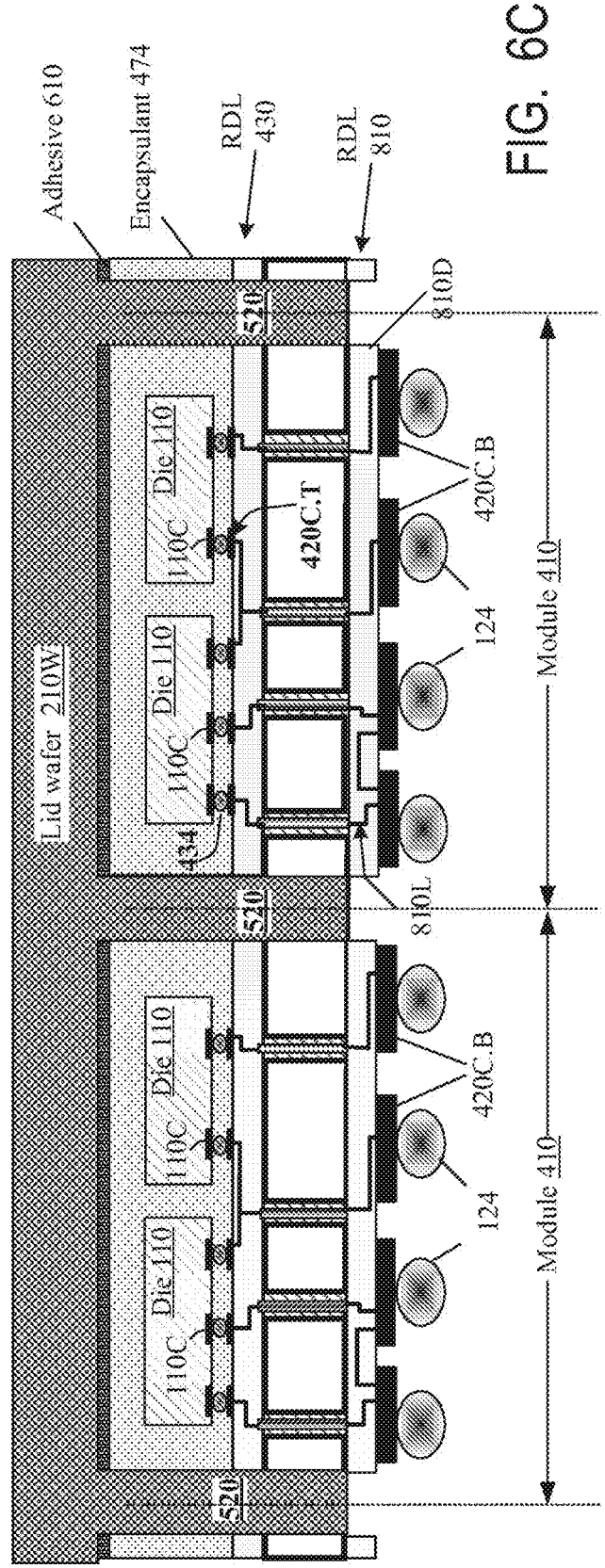

Subsequent processing depends on a particular application. In the example of FIG. 6C, redistribution layer 810 is formed on the bottom of interposer substrates 420S to provide bottom contact pads 420C.B and interconnect these contact pads and the bottom ends of vias 450 as desired. The interconnection is accomplished by the RDL's conductive lines 810L insulated from each other and the substrates 420S by dielectric 810D. If needed, solder bumps or other connections 124 can be formed on contact pads 420C.B for attachment to a wiring substrate (such as WS 120 in FIG. 1) or other components. In some embodiments, contact pads 420C.B are at a higher pitch than contact pads 420C.T, and the connections 124 are larger than 434, to accommodate different fabrication technologies as described above, and/or to provide stronger connections at the bottom, and/or for other reasons. These details are not limiting; e.g. the contact pad pitch and connection size at the interposer bottom may be the same or smaller than at the interposer top. Also, the invention is not limited to interposers.

Figure 6D:
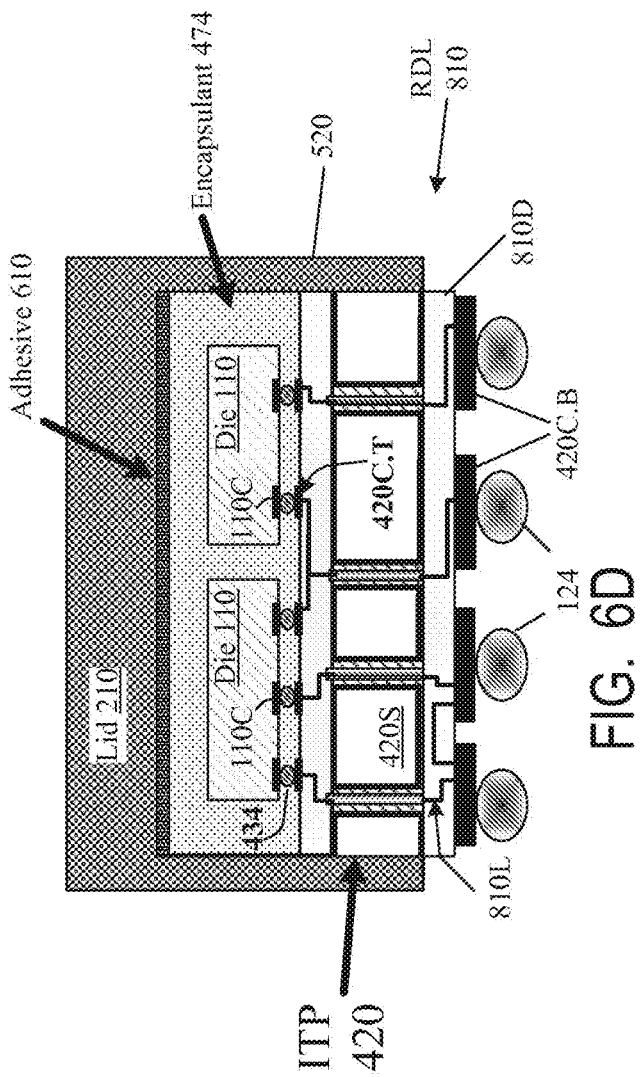

If desired, the structure can be diced along legs 520 to form multiple die assemblies each of which can be used as a component in a larger assembly. One die assembly is shown in FIG. 6D. Alternatively, the structure can be diced at a later stage, e.g. after connection to other components (not shown), or left undiced. If any portion of the structure is undiced to include multiple modules 410 in different cavities 510, then RDL 810 may extend under legs 520 to interconnect such modules 410.

In the embodiment shown, the bottom surface of legs 520 is level with the bottom surfaces of interposer substrates 420S. Contact pads 420C.B are located below the legs and outside of the cavity 520.

Figure 6E:
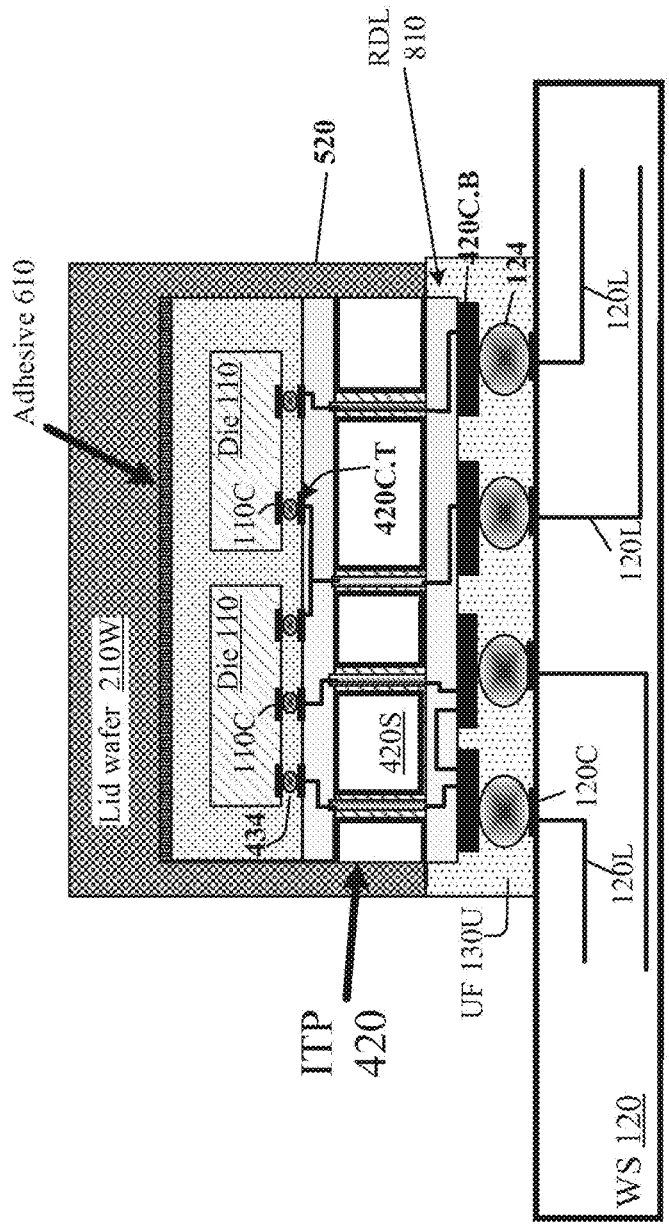

FIG. 6E shows an example with the assembly of FIG. 6D attached to WS 120 by connections 124 (e.g. solder or diffusion bonding or adhesive or some other type). Underfill 130U is introduced between the assembly and WS 120 to glue the assembly to the WS. As shown, underfill 130U also glues the WS 120 to legs 520, but this is not necessary. For example, if RDL 810 extends below the legs 520, then underfill 130U will not reach the legs.

As noted above, adhesive 610 may or may not be present on legs 520, and if not then thermal stresses due to the CTE mismatch between the lid and the module 410 can be reduced.

In the fabrication processes described above, use of trenches 478 allows precise positioning of lid wafer 210W if the trenches and the legs 520 are formed with high precision (e.g. using semiconductor technology). Also, in some embodiments, the lid 210 closely matches the CTE of ITP 420 to reduce the thermal stresses due to the CTE mismatch between the lid and the ITP. In particular, in some embodiments, the lid's CTE is closer to ITP 420 than to each of encapsulant 474 and adhesive 610. In some embodiments, the CTE difference between the lid and the ITP is at most 20% of the CTE difference between the lid and each of encapsulant 474 and adhesive 610. In some embodiments, such CTE relationships are true for ITP substrate 420S: the lid's CTE is closer to substrate 420S than to each of encapsulant 474 and adhesive 610, and further the CTE difference between the lid and substrate 420S can be at most 20% of the CTE difference between the lid and each of encapsulant 474 and adhesive 610. For example, the lid wafer and the ITP substrate 420S can be formed of the same material (e.g. monocrystalline silicon), so their CTEs can be identical. In some embodiments, the lid is glass having a CTE of 4.0 ppm/° K; ITP substrate 420S is silicon having a CTE of 2.6 ppm/° K; ITP 420 has a CTE of 3 ppm/° K; encapsulant 474 is mold compound (organic polymeric compound with additives as described above which can be formed by molding at a fairly low temperature, e.g. below 450° C.) having a CTE of 12 ppm/° K; adhesive 610 is epoxy having a CTE of 55 ppm/° K. (In this disclosure, all the CTE figures are at room temperature unless noted otherwise.) Any one or more of the CTE values can deviate from the amounts indicated to provide infinite combinations of CTE values.

Figure 7A:
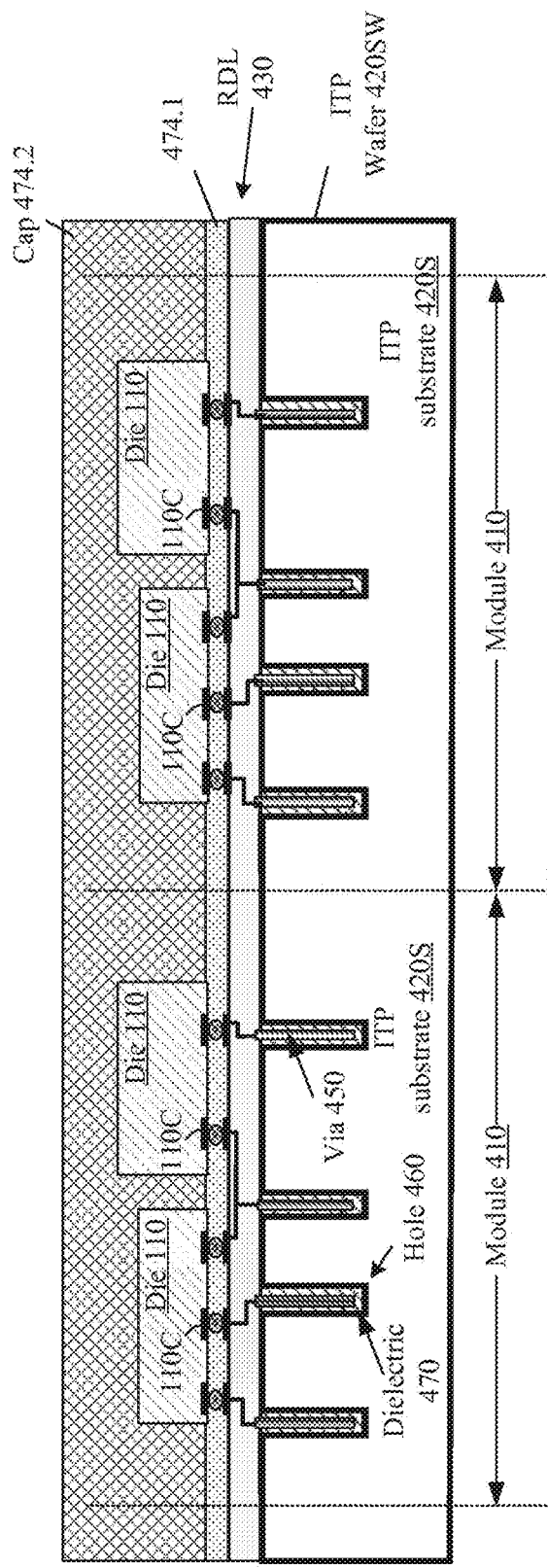
Figure 7B:
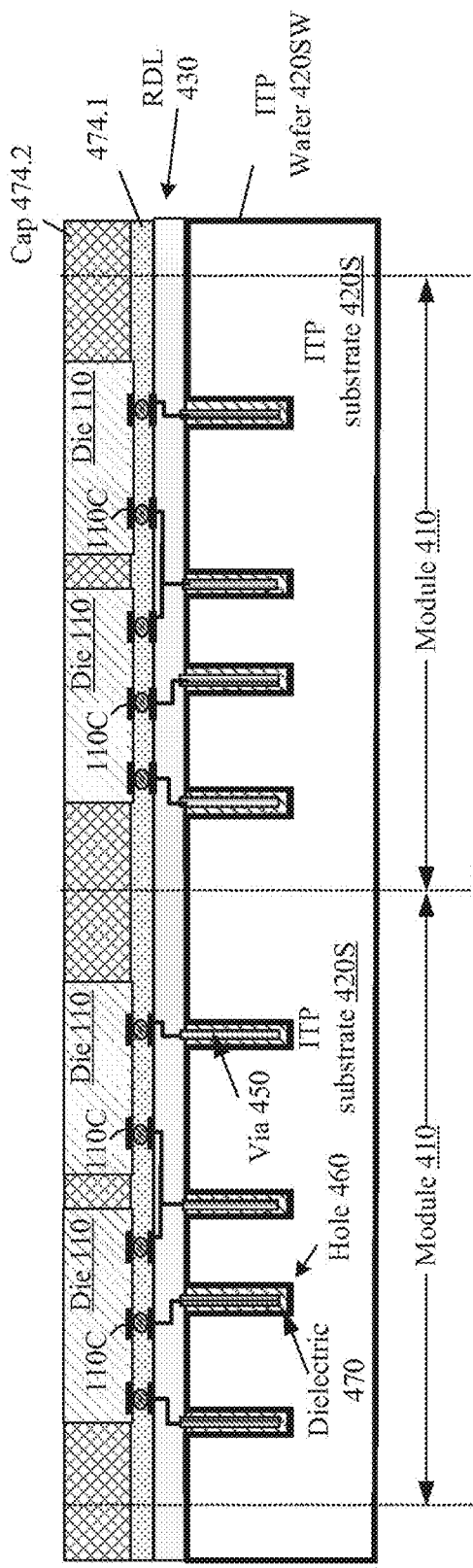

Many variations are possible. For example, adhesive 610 can be metal or silicon dioxide or metal silicide or some other inorganic or organic material. One possibility is illustrated in FIGS. 7A-7C. FIG. 7A is similar to 4A. One difference between FIGS. 7A and 4A is that in FIG. 7A the die 110 have different heights in each module 410. Different heights are also possible in the processes of FIGS. 4A-6E described above. Also, in FIG. 7A, encapsulant 474 is replaced by bottom layer 474.1 and cap layer 474.2. Bottom layer 474.1 can be an underfill which may or may not spread over the rest of substrate wafer 420SW. Layer 474.1 can be formed using conventional capillary or no-flow underfill materials (typically organic polymers with suitable fillers, initially liquid but then cured, or possibly in tape form). Such underfill materials can be deposited by conventional underfill processes. Layer 474.1 may include additional sub-layers. Cap layer 474.2 can be metal, silicon dioxide, or some other organic or inorganic material, deposited by physical vapor deposition (PVD) or chemical vapor deposition (CVD) or in some other way to a suitable height (above the die 110 for example). In some embodiments, layer 474.2 has a higher elastic modulus than layer 474.1. For example, layer 474.2 may have an elastic modulus of 47 GPa or higher, possibly at least 60 GPa, possibly at least 75 GPa, possibly at least 100 GPa; while layer 474.1 may have a modulus of at most 10 GPa, possibly below 500 MPa. These examples are not limiting.

Then (FIG. 7B) the structure is polished on top to obtain a planar top surface. All the die become exposed, so the taller die are polished down. In other embodiments, less than all die are exposed. The polishing can be by CMP and/or some other process (including possibly mechanical non-chemical polishing and/or chemical etching).

Then fabrication proceeds as described above in connection with FIGS. 4B.1-4B.2 to form trenches such as 478. Separately, lid wafer 210W is formed as described in connection with FIGS. 5.1-5.2.

Then (FIG. 7C) legs 520 of lid wafer 210W are inserted into trenches 478. The process is as described above in connection with FIG. 6A, but in some embodiments no adhesive is used for the lid wafer attachment. The lid is bonded to the structure with modules 410, as symbolically shown by interface (IF) layer 870 in FIG. 7C. The nature of interface 870 depends on the materials and bonding processes involved. In particular, IF 870 may have a different structure at the interface with cap layer 474.2 than at the interface with die 110. In some embodiments, such bonding results in improved thermal dissipation of the heat generated by the die when the structure is used.

For example, if cap 474.2 is metal and lid wafer 210W is silicon, then the portion of IF 870 at cap 474.2 can be metal silicide formed by heat. If the top surface of die 110 is silicon, then the portion of IF 870 at the die 110 can be formed by silicon-to-silicon diffusion bonding. In some embodiments, the die's top surfaces (and hence the lid) are electrically insulated from the die's circuitry by a dielectric layer (e.g. if the die are based on a silicon-on-insulator (SOI) substrate then the dielectric can be buried oxide), and/or by PN junctions (e.g. the die's transistor channels may be formed in the die's wells electrically isolated from the die's top surfaces by PN junctions). Different die may have different construction and materials, and the bond type and electrical insulation (or lack thereof) may vary from die to die.

Cap 474.2 can alternatively be a mold compound such as described above. In some embodiments, lid wafer 210W is metal, or at least has a metal bottom surface, e.g. nickel or gold or some other metal that can bond with the top surfaces of one or more of the die at acceptably low temperatures. If any die's top surface is silicon, then IF 870 is a silicon-metal material, possibly metal-silicide, at the die's top surface. In some embodiments, the top surfaces of one or more of the die are covered by metal, e.g. electrolessly plated metal, and the IF 870 is metal-to-metal bonding interface at such die. If cap 474.2 is a mold compound, the cap is not necessarily bonded to the lid.

In some embodiments, the die are not bonded to the lid wafer. For example, there can be thermal interface material (TIM, either dielectric or electrically conductive) between the die and the lid wafer. The thermal interface material has higher thermal conductivity than air at atmospheric pressure and room temperature.

Figure 8B:
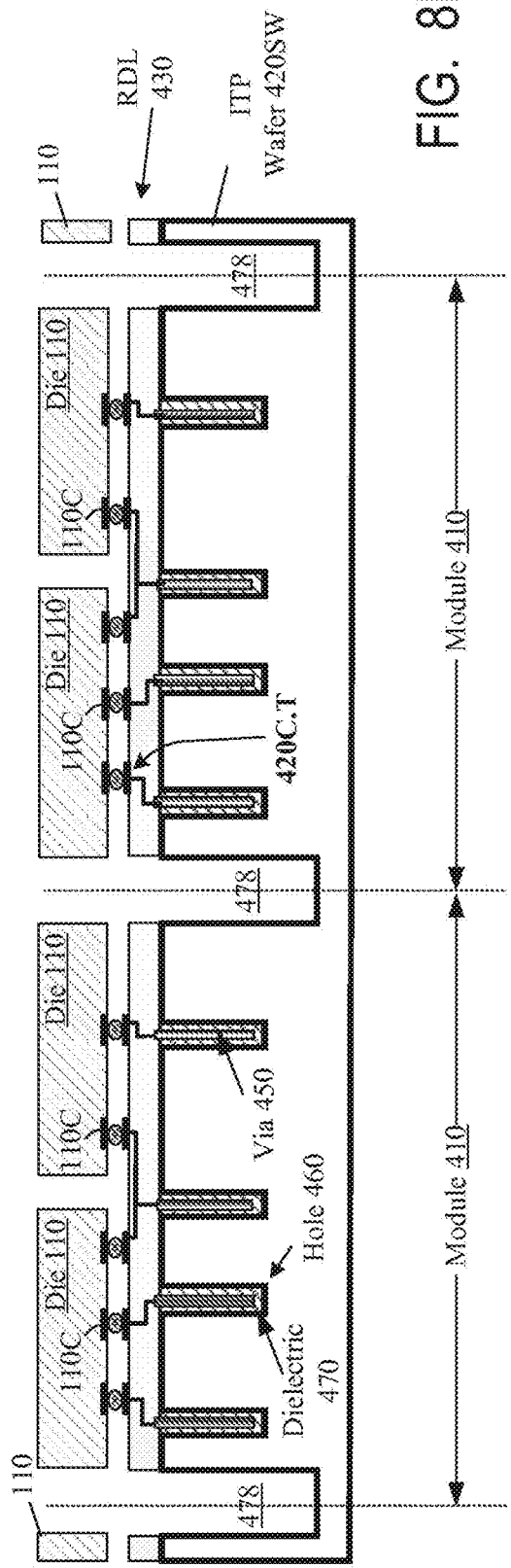

In another variation, the attachment of die 110 to interposer 120 is delayed until after the trench formation. FIG. 8A illustrates the structure at the stage of FIGS. 4B.1-4B.2. The trenches 478 have been formed, but the die have not yet been attached. The die 110 are attached later, as shown in FIG. 8B. In this embodiment, the die's edges are positioned above the sidewalls of trenches 478, i.e. the die extend laterally to the trenches, and this is also possible with the processes of FIGS. 4A-7C but is not necessary either in those processes or in the processes of FIG. 8B.

Encapsulant 474 (FIG. 8C), including the underfill, is formed to cover the die and the trench sidewalls but not the middle portions of the trenches. The encapsulant may or may not have a low elastic modulus (e.g. 10 GPa or below) for high compliance as described above. The lid attachment and subsequent processing can be as in other embodiments described above.

Advantageously, the trench formation is not encumbered by either the die or the encapsulant (the die may hamper the trench formation because the trench formation should not damage the die, e.g. by high temperatures or other process conditions).

Figure 8C:
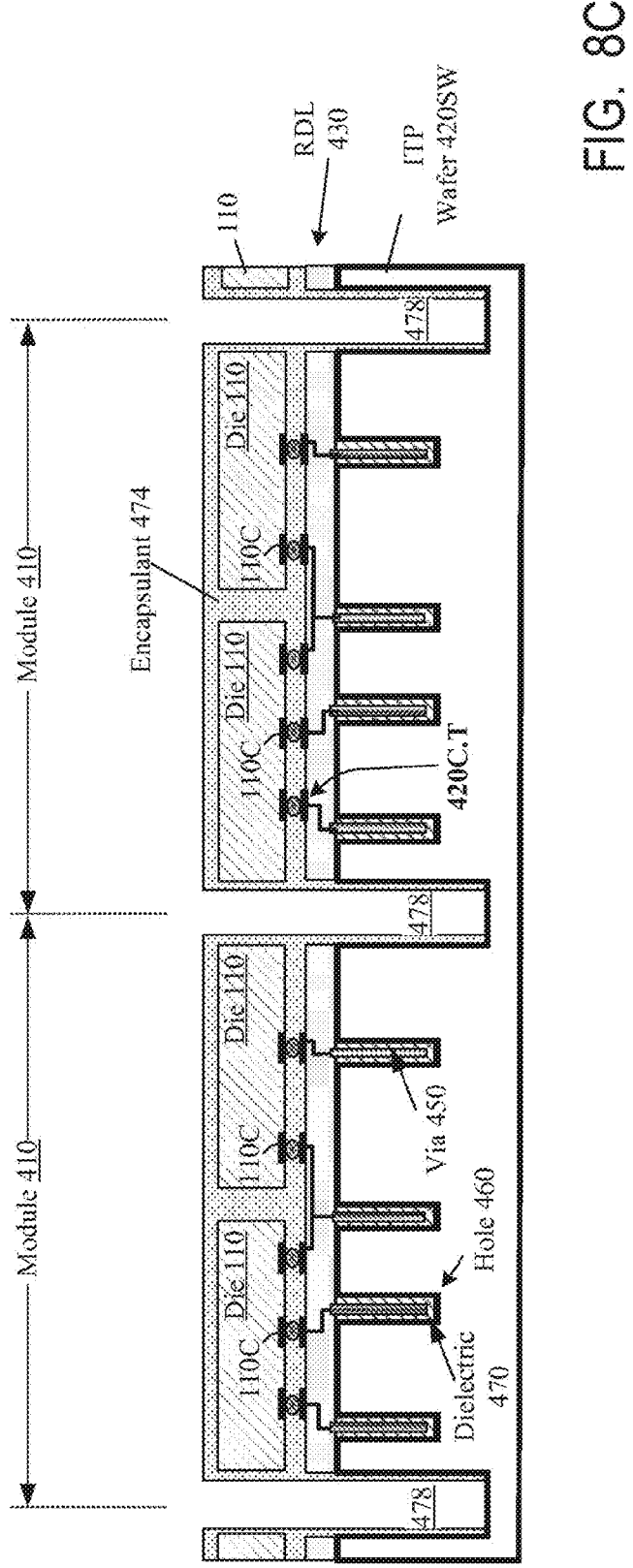
Figure 9A:
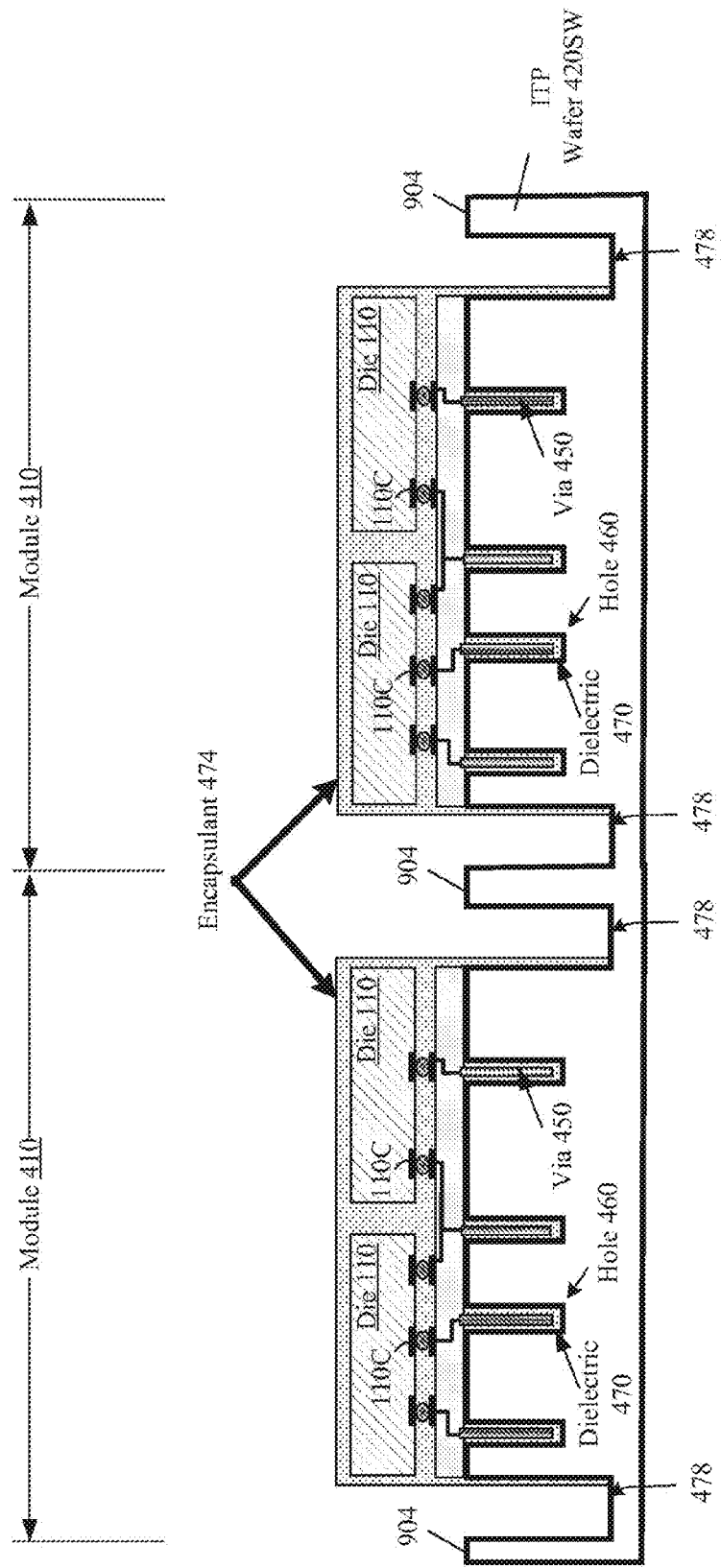
Figure 9B:
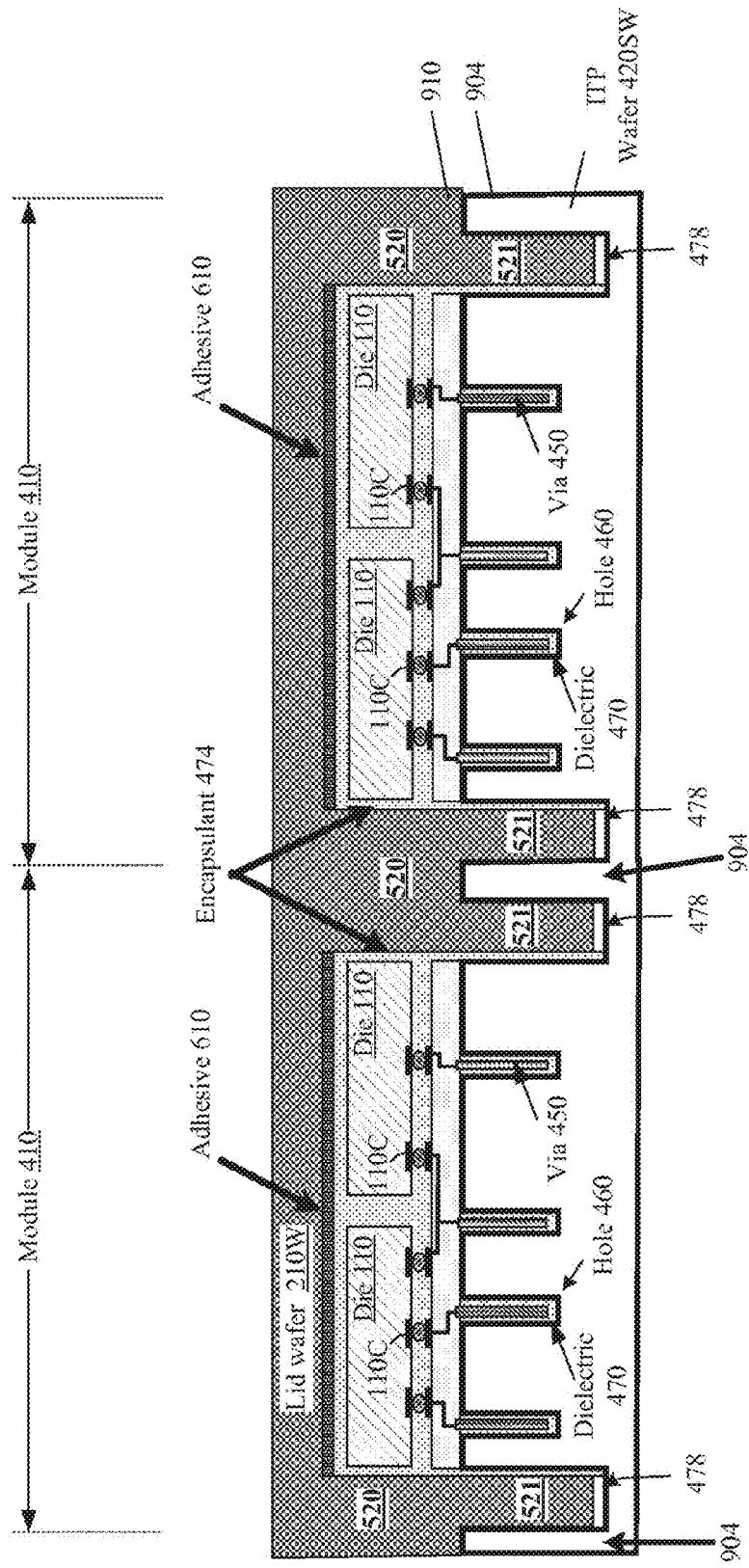
Figure 9C:
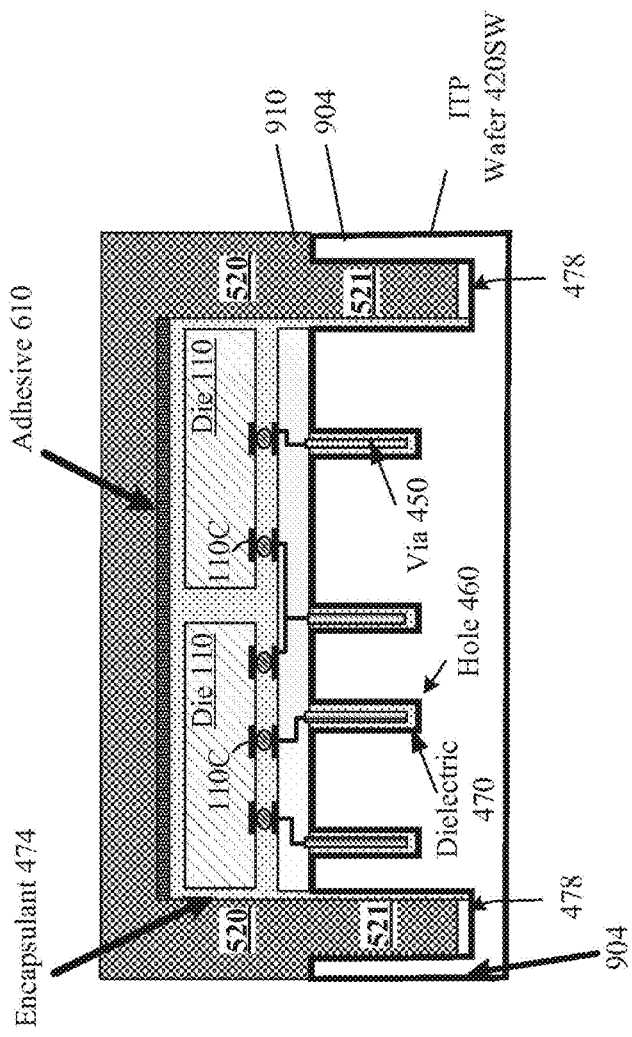

FIG. 9A shows another variation, similar to FIG. 8C but trenches 478 of adjacent modules are separated by protrusions 904 of ITP wafer 420SW. Protrusions 904 can be formed simply by the etch that creates the trenches 478. FIG. 9B shows the same structure with lid wafer 210W. The lid's legs 520 are split at the bottom into fingers 521 each of which enters a corresponding trench 478. The legs' areas 910 separate the modules and rest on protrusions 904. Subsequent processing may include thinning of the ITP wafer and the lid, and other steps described above in connection with FIGS. 4A-8C. The structure can be diced along the protrusions 904 and areas 910 to separate the modules from each other; a single module is shown in FIG. 9C.

Figure 10:
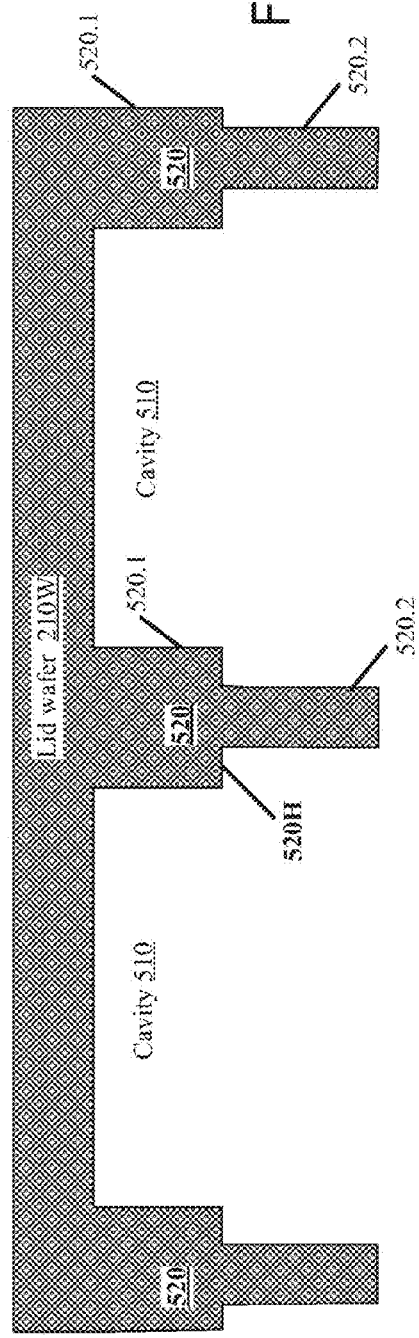
Figure 11:
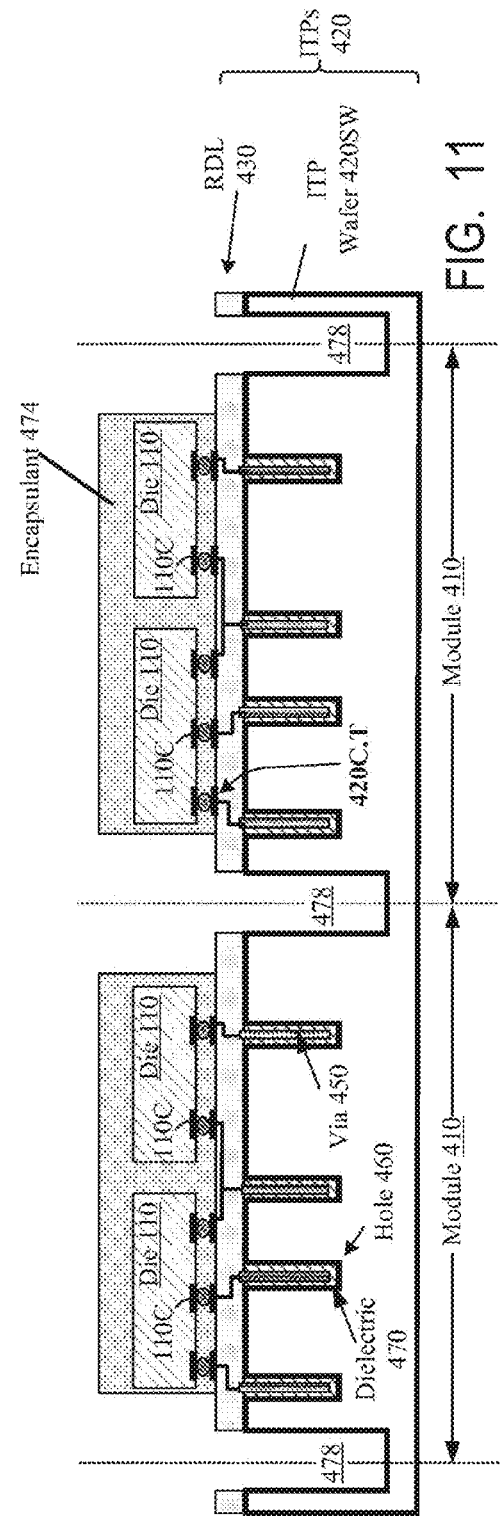
Figure 12A:
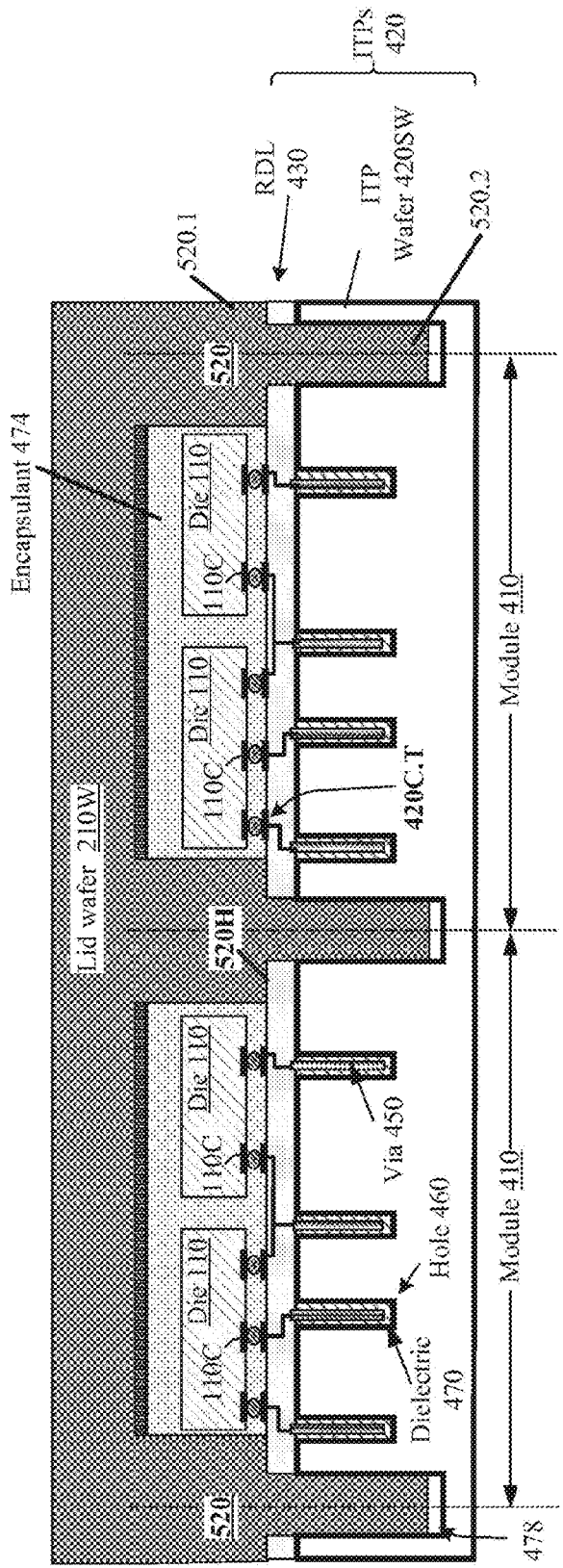

The lid's cavity surface can be modified in many ways. For example, in FIG. 10, the lid's legs 520 have wider segments 520.1 and narrower segments 520.2. FIG. 11 shows the corresponding modules 410. The modules are as in FIG. 4B.1 but encapsulant 474 is absent in an area adjacent to the trenches 478 (the encapsulant can be removed from this area by a masked etch or laser; or can be blocked from this area by a suitable molding process for example). This area will be occupied by wider segments 520.1. The remaining features can be as in the other embodiments described above. FIG. 12A shows the lid wafer 210W attached to the interposers 420; the legs' lower segments 520.2 enter the trenches 478 as in FIG. 6A, but the wider segments 520.1 are out of the trenches; the wider segments have horizontal shoulder surfaces 520H at the bottom, and these shoulder surfaces rest on interposers 420 (on RDL 430 in the example shown).

Figure 12B:
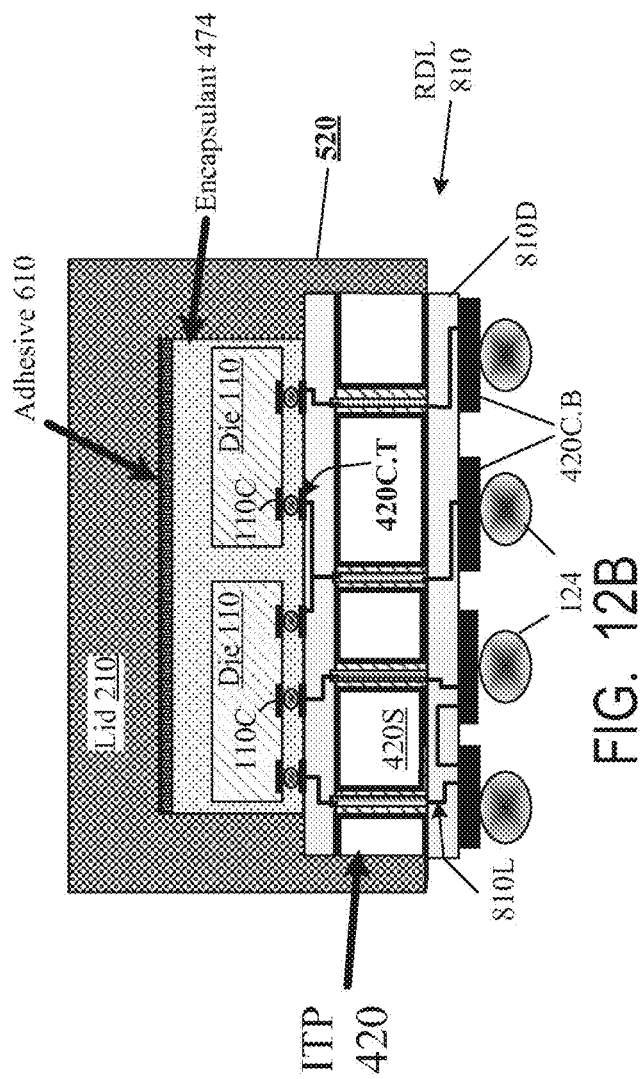

The remaining processing and variations can be as described above in connection with FIGS. 4A-9C. FIG. 12B shows an exemplary structure at the stage of FIG. 6D if the structure is processed as described above for FIG. 6D.

Figure 13:
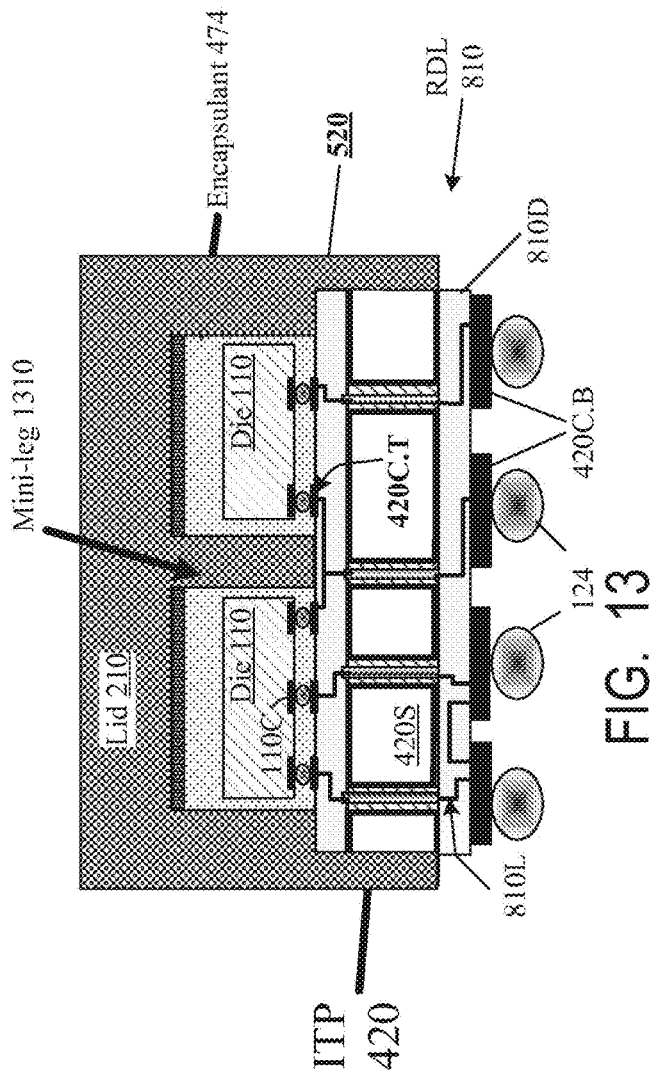

Lid 210 may have non-planar features, protrusions, through-holes, and other geometrical variations. See for example FIG. 13 showing the same structure as in FIG. 12B but with a lid having a projection (mini-leg) 1310. In this example, the mini-leg 1310 comes down between the two die 110 and stops on RDL 810; when the structure was fabricated, the mini-leg did not enter a trench 478. FIG. 14.1 shows a vertical cross section of an exemplary lid wafer 210W used in FIG. 13; the wafer is shown before dicing, and the cross sectional plane is the same as in FIG. 13. FIG. 14.2 shows a bottom view of the cavity wafer. Mini-legs 1310 are positioned in a center portion of each cavity 510. Two cavities 510 are shown, marked 510.1 and 510.2. In cavity 510.2, the mini-leg 1310 traverses the cavity to meet the legs 520. In cavity 510.1, the mini-leg 1310 does not traverse the cavity, i.e. does not meet the legs 520. Any mini-leg geometry is possible; multiple die and multiple mini-legs can be present in each cavity 510.

The mini-legs 1310 strengthen the lid wafer and hence the entire structure, and may help in heat removal from modules 410 if the lid wafer is metal or some other highly thermally conductive material (e.g. more thermally conductive than air or other ambient).

Various features described above can be used together or in any combination. For example, the variations described above in connection with FIGS. 7A-9C can be used in the embodiments described in connection with FIGS. 10-14.2 and vice versa. FIG. 15 shows an exemplary structure like in FIG. 13 (with mini-legs 1310) but manufactured using the process of FIGS. 7A-7C (the lid is attached to modules 410 with no encapsulant therebetween). The structure is after dicing (i.e. at the stage of FIG. 6D). Other variations are possible.

As mentioned above, the legs 520 do not have to surround the cavity 510 on all sides. FIG. 16 shows a lid wafer example (perspective view) with each cavity having legs 520 on only two sides. In the corresponding ITP wafer 210W, shown in top view, each trench 478 runs across the wafer from edge to edge. The modules 410 are at the middle of the ITP wafer. Advantageously, lid wafer 210W can be placed over the modules by first positioning the lid wafer at the edge of the ITP wafer (e.g. at the top edge in the view of FIG. 16) with the legs 520 at the edges of trenches 478, and then sliding the lid wafer towards the modules 410 while the legs 520 remain in the trenches.

Regardless of how the lid wafer is placed, all or part of encapsulant 474 can be introduced into cavities 520 after the lid wafer is placed over the modules if the cavities do not completely surround the modules. The encapsulant so deposited can be adhesive that glues the lid wafer to the modules 410; adhesive 610 can be omitted.

The lid may or may not have protrusions (like mini-legs 1310) or other features described above. A lid wafer with mini-legs 1310 suitable for the process of FIG. 16 is shown in FIG. 17.

Many other variations are possible. Some embodiments of the invention are defined by the following clauses:

Clause 1. A fabrication method comprising:
obtaining a first structure (e.g. lid 210 or lid wafer 210W) comprising one or more cavities;
obtaining a second structure comprising a first microelectronic component (e.g. ITP; this clause is not limited to interposers) and one or more second microelectronic components (e.g. 110, possibly an MCM), wherein:
the first microelectronic component comprises a first substrate, the first microelectronic component comprising first circuitry (the first substrate can be a support for the circuitry and/or provide part of the circuitry, e.g. provide a transistor region if the first substrate is semiconductor; non-semiconductor substrates are possible), wherein the first substrate comprises a first side (e.g. top) and one or more first holes (e.g. trenches 478) in the first side;
one or more second microelectronic components each of which comprises one or more respective second substrates, each second microelectronic component comprising respective second circuitry, each second microelectronic component being attached to the first side of the first substrate, wherein the second circuitry of at least one second microelectronic component is electrically coupled to the first circuitry;
attaching the first structure to the second structure so that at least one second microelectronic component is located in at least one of the cavities and so that at least a portion of a sidewall (e.g. of a surface of leg 520 or 520.2) of at least one of the one or more cavities is located in a corresponding first hole.

Clause 2. The fabrication method of clause 1 wherein during the attaching operation, the one or more first holes do not go through the substrate of the first microelectronic component; and
the method further comprises, after said attaching, thinning the first substrate to turn the one or more first holes into one or more through-holes in the first substrate.

Clause 3. The fabrication method of clause 2 wherein the first circuitry comprises one or more conductive vias (e.g. 450) at least partially located in the first substrate and electrically coupled to the second circuitry of at least one second microelectronic component; and
said thinning of the first substrate exposes the one or more conductive vias on a second side of the first substrate, the second side being opposite to the first side of the first substrate.

Clause 4. The fabrication method of clause 2 wherein the one or more first holes completely laterally surround at least one second microelectronic component.

Clause 5. The fabrication method of clause 1 wherein after the attaching operation, at least a portion of a sidewall of at least one cavity does not adhere to the first structure.

Clause 6. The fabrication method of clause 1 wherein the attaching operation causes the second structure to adhere to one or more regions inside the one or more cavities but not to any other regions, the one or more regions being at a distal end from the first substrate. For example, in FIG. 6A, the one or more regions may correspond to the cavity bottom; the cavity bottom is located at the top of modules 410; the cavity bottom is at the distal end (far end) from substrates 420S.

Clause 7. A fabrication method comprising:
obtaining an assembly comprising:
a first structure comprising one or more cavities;
a second structure attached to the first structure and comprising a first microelectronic component and one or more second microelectronic components, wherein:
the first microelectronic component comprises a first substrate, the first microelectronic component comprising first circuitry; and
one or more second microelectronic components each of which comprises one or more respective second substrates, each second microelectronic component comprising a respective second circuitry, the one or more second microelectronic components being attached to a first side of the first substrate, wherein the second circuitry of at least one second microelectronic component is electrically coupled to the first circuitry;

wherein at least one second microelectronic component is located in at least one of the cavities;

wherein the method further comprises thinning the assembly, wherein the thinning of the assembly comprises simultaneous thinning of the second structure and a sidewall of the cavity.

Clause 8. The method of clause 7 wherein the thinning of the assembly comprises simultaneous thinning of the first substrate and a sidewall of the cavity (e.g. if legs 520 are thinned simultaneously with substrates 420S).

Clause 9. The method of clause 8 wherein the first circuitry comprises one or more conductive vias at least partially located in the first substrate and electrically coupled to the second circuitry of at least one second microelectronic component; and said thinning of the assembly exposes the one or more conductive vias on a second side of the first substrate, the second side being opposite to the first side of the first substrate.

Clause 10. An assembly comprising:

a first structure comprising one or more cavities;

one or more modules each of which is at least partially located in a corresponding one of the one or more cavities, each module comprising a respective first microelectronic component and one or more respective second microelectronic components;

wherein in each module:
the first microelectronic component comprises a respective first substrate, the first microelectronic component comprising first circuitry; and
each of the one or more second microelectronic components comprises one or more respective second substrates, each of the respective second microelectronic components comprising a respective second circuitry, the one or more second microelectronic components being attached to a top side of the first substrate, wherein the second circuitry of at least one second microelectronic component is electrically coupled to the first circuitry; and
at least one second microelectronic component is located in the corresponding cavity;

wherein for at least one module, the first substrate comprises one or more conductive vias passing through the first substrate between the top side of the first substrate and a bottom side of the first substrate, the one or more conductive vias being electrically coupled to the second circuitry of at least one second microelectronic component of the module;

wherein for at least one module:
the first substrate is at least partially located in the corresponding cavity; and
the first circuitry comprises one or more contact pads located at the bottom of the first microelectronic component and at least partially located outside of the corresponding cavity;
the module comprises a material separating the second microelectronic components from a surface of the corresponding cavity;
at least one of (A) and (B) is true for a coefficient of thermal expansion (CTE) of a sidewall of the corresponding cavity:
(A) the CTE of the sidewall is closer to a CTE of the first microelectronic component than to the CTE of the material;
(B) the CTE of the sidewall is closer to a CTE of the first substrate than to the CTE of the material.

Clause 11. The assembly of clause 10 wherein (A) is true.

Clause 12. The assembly of clause 10 wherein (B) is true.

Clause 13. An assembly comprising:

a first structure comprising one or more cavities;

one or more modules each of which is at least partially located in a corresponding one of the one or more cavities, each module comprising a respective first microelectronic component and one or more respective second microelectronic components;

wherein in each module:
the first microelectronic component comprises a respective first substrate, the first microelectronic component comprising first circuitry; and
each of the one or more second microelectronic components comprises one or more respective second substrates, each of the respective second microelectronic components comprising a respective second circuitry, the one or more second microelectronic components being attached to a top side of the first substrate, wherein the second circuitry of at least one second microelectronic component is electrically coupled to the first circuitry;
at least one second microelectronic component is located in the corresponding cavity;

wherein for at least one module, the first substrate comprises one or more conductive vias passing through the first substrate between the top side of the first substrate and a bottom side of the first substrate, the one or more conductive vias being electrically coupled to the second circuitry of at least one second microelectronic component of the module;

wherein for at least one module:
the first substrate is at least partially located in the corresponding cavity;
the first circuitry comprises one or more contact pads located at the bottom of the first microelectronic component and at least partially located outside of the corresponding cavity; and
the module is attached to a surface of the corresponding cavity by an interface comprising, at the surface of the corresponding cavity, a material for which at least one of the following is true:
(i) the material comprises metal;
(ii) the material comprises metal silicide;
(iii) the material comprises silicon dioxide;
(iv) the material has an elastic modulus of at least 40 GPa.

Clause 14. The method of clause 13 wherein (i) is true.

Clause 15. The method of clause 13 wherein (ii) is true.

Clause 16. The method of clause 13 wherein (iii) is true.

Clause 17. The method of clause 13 wherein (iv) is true.

Clause 18. The assembly of clause 13 wherein for at least one module for at least one module for which at least one of (i) through (iv) is true, the corresponding cavity is attached to the module only above the one or more second microelectronic components.

Clause 20. An assembly comprising:

a first structure comprising one or more cavities;

one or more modules each of which is at least partially located in a corresponding one of the one or more cavities, each module comprising a respective first microelectronic component and one or more respective second microelectronic components;

wherein in each module:
the first microelectronic component comprises a respective first substrate, the first microelectronic component comprising first circuitry; and each of the one or more second microelectronic components comprises one or more respective second substrates, each of the respective second microelectronic components comprising a respective second circuitry, the one or more second microelectronic components being attached to a top side of the first substrate, wherein the second circuitry of at least one second microelectronic component is electrically coupled to the first circuitry;

at least one second microelectronic component is located in the corresponding cavity;

wherein for at least one module, the first substrate comprises one or more conductive vias passing through the first substrate between the top side of the first substrate and a bottom side of the first substrate, the one or more conductive vias being electrically coupled to the second circuitry of at least one second microelectronic component of the module;

wherein for at least one module:
the first substrate is at least partially located in the corresponding cavity;
the first circuitry comprises one or more contact pads located at the bottom of the first microelectronic component and at least partially located outside of the corresponding cavity; and
the assembly comprises a material in physical contact with the module and a surface of the corresponding cavity, the material being more thermally conductive than air at atmospheric pressure and room temperature.

The invention is not limited to the embodiments described above. Other embodiments and variations are within the scope of the invention, as defined by the appended claims.

The invention claimed is:
1. An assembly comprising:
a first structure comprising a cavity; and
a second structure attached to the first structure and comprising a first microelectronic component and one or more second microelectronic components, wherein:
the first microelectronic component comprises a first substrate, the first microelectronic component comprising first circuitry, wherein the first substrate comprises a first side and one or more first holes in the first side;
each second microelectronic component comprises one or more respective second substrates, each second microelectronic component comprising respective second circuitry, each second microelectronic component being attached to the first side of the first substrate, wherein the second circuitry of each second microelectronic component is electrically coupled to the first circuitry;
wherein each second microelectronic component is located in the cavity and at least a portion of a sidewall of the cavity is located in a corresponding first hole such that at least a portion of a sidewall of the corresponding first hole extends laterally along a straight line adjacent to at least one second microelectronic component located in said cavity, and such that said at least a portion of a sidewall of the cavity extends laterally along the portion of the corresponding first hole.

2. The assembly of claim 1 wherein the one or more first holes completely laterally surround at least one second microelectronic component.

3. The assembly of claim 1 wherein a portion of a sidewall of the cavity in one said first hole completely laterally surrounds at least one second microelectronic component.

4. The assembly of claim 1 wherein at least a portion of a sidewall of the cavity does not adhere to the second structure.

5. The assembly of claim 1 wherein the second structure adheres to one or more regions inside the cavity at a distal end from the first substrate, but not to any other region.

6. The assembly of claim 1 wherein the first circuitry comprises one or more conductive vias passing through the first substrate between a top side of the first substrate and a bottom side of the first substrate, the one or more conductive vias being electrically coupled to the second circuitry of at least one second microelectronic component.

7. The assembly of claim 1 wherein:
the assembly comprises a material separating each second microelectronic component in the cavity from a surface of the cavity; and
a CTE (coefficient of thermal expansion) of the sidewall is closer to a CTE of the first microelectronic component than to a CTE of the material.

8. The assembly of claim 1 wherein:
the assembly comprises a material separating each second microelectronic component in the cavity from a surface of the cavity; and
a CTE of the sidewall is closer to a CTE of the first substrate than to a CTE of the material.

9. The assembly of claim 1 wherein at least one second microelectronic component is attached to a surface of the cavity by a first material consisting of one or more of second materials each of which is selected from a group consisting of one or more metals, one or more metal compounds, and silicon dioxide.

10. The assembly of claim 1 wherein the first material consists of one or more metals.

11. The assembly of claim 1 wherein the first material is metal silicide.

12. The assembly of claim 1 wherein the first material is silicon dioxide.

13. An assembly comprising:
a first structure comprising a cavity; and
a module at least partially located in the cavity, the module comprising a first microelectronic component and one or more second microelectronic components;
wherein:
the first microelectronic component comprises a first substrate, the first microelectronic component comprising first circuitry comprising one or more conductive vias passing through the first substrate between a top side of the first substrate and a bottom side of the first substrate; and
each of the one or more second microelectronic components comprises one or more semiconductor integrated circuits located in the cavity and electrically coupled to one or more of the one or more conductive vias but electrically insulated from the first structure; and
the first circuitry comprises one or more contact structures exposed at the bottom of the first microelectronic component, each said contact structure having at least a portion which is not inside the cavity and which is available for direct attachment to a circuit outside of the assembly but is not directly attached to a circuit outside of the assembly.

14. The assembly of claim 13 wherein a bottom of a sidewall of the cavity is at a level below each said semiconductor integrated circuit and completely laterally surrounds each said semiconductor integrated circuit.

15. The assembly of claim 13 wherein at least a portion of a sidewall of the cavity does not adhere to the second structure.

16. The assembly of claim 13 wherein the second structure adheres to one or more regions inside the cavity at a distal end from the first substrate, but not to any other region.

17. The assembly of claim 13 wherein:
- the assembly comprises a material separating each second microelectronic component from a surface of the cavity; and
- a CTE (coefficient of thermal expansion) of the sidewall is closer to a CTE of the first microelectronic component than to a CTE of the material.

18. The assembly of claim 13 wherein:
- the assembly comprises a material separating each second microelectronic component from a surface of the cavity; and
- a CTE of the sidewall is closer to a CTE of the first substrate than to a CTE of the material.

19. The assembly of claim 13 wherein at least one second microelectronic component is attached to a surface of the cavity by a first material consisting of one or more of second materials each of which is selected from a group consisting of one or more metals, one or more metal compounds, and silicon dioxide.

20. The assembly of claim 19 wherein the material is silicon dioxide.

* * * * *